United States Patent
Zope et al.

(10) Patent No.: US 10,699,946 B2
(45) Date of Patent: Jun. 30, 2020

(54) METHOD OF ENABLING SEAMLESS COBALT GAP-FILL

(71) Applicant: Applied Materials, Inc., Santa Clara, CA (US)

(72) Inventors: Bhushan N. Zope, Santa Clara, CA (US); Avgerinos V. Gelatos, Redwood City, CA (US); Bo Zheng, Saratoga, CA (US); Yu Lei, Belmont, CA (US); Xinyu Fu, Pleasanton, CA (US); Srinivas Gandikota, Santa Clara, CA (US); Sang Ho Yu, Cupertino, CA (US); Mathew Abraham, Mountain View, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 32 days.

(21) Appl. No.: 15/364,780

(22) Filed: Nov. 30, 2016

(65) Prior Publication Data

US 2017/0084486 A1    Mar. 23, 2017

Related U.S. Application Data

(63) Continuation of application No. 14/482,601, filed on Sep. 10, 2014, now Pat. No. 9,685,371.
(Continued)

(51) Int. Cl.
*H01L 21/768* (2006.01)
*H01L 21/285* (2006.01)
(Continued)

(52) U.S. Cl.
CPC ........ *H01L 21/76877* (2013.01); *C23C 16/18* (2013.01); *H01L 21/2855* (2013.01);
(Continued)

(58) Field of Classification Search
CPC .......................... H01L 21/76877; C23C 16/18
See application file for complete search history.

(56) References Cited

U.S. PATENT DOCUMENTS

| 4,589,193 A | 5/1986 | Goth et al. |
| 5,888,888 A | 3/1999 | Talwar et al. |
| (Continued) | | |

FOREIGN PATENT DOCUMENTS

| CN | 101466863 A | 6/2009 |
| JP | H11-345872 A | 12/1999 |
| (Continued) | | |

OTHER PUBLICATIONS

International Search Report and Written Opinion for International Application No. PCT/US2013/033437 dated Jul. 24, 2013.
(Continued)

*Primary Examiner* — Moazzam Hossain
(74) *Attorney, Agent, or Firm* — Patterson + Sheridan LLP

(57) ABSTRACT

Methods for depositing a metal layer in a feature definition of a semiconductor device are provided. In one implementation, a method for depositing a metal layer for forming a semiconductor device is provided. The method comprises performing a cyclic metal deposition process to deposit a metal layer on a substrate and annealing the metal layer disposed on the substrate. The cyclic metal deposition process comprises exposing the substrate to a deposition precursor gas mixture to deposit a portion of the metal layer on the substrate, exposing the portion of the metal layer to either a plasma treatment process or hydrogen annealing process and repeating the exposing the substrate to a deposition precursor gas mixture and exposing the portion of the
(Continued)

metal layer to either a plasma treatment process or hydrogen annealing process until a predetermined thickness of the metal layer is achieved.

20 Claims, 12 Drawing Sheets

Related U.S. Application Data

(60) Provisional application No. 61/883,480, filed on Sep. 27, 2013.

(51) Int. Cl.
  *C23C 16/18* (2006.01)
  *H01L 23/532* (2006.01)

(52) U.S. Cl.
  CPC .. *H01L 21/28562* (2013.01); *H01L 21/28568* (2013.01); *H01L 21/76814* (2013.01); *H01L 21/76843* (2013.01); *H01L 21/76876* (2013.01); *H01L 21/76879* (2013.01); *H01L 21/76883* (2013.01); *H01L 23/53209* (2013.01)

(56) References Cited

U.S. PATENT DOCUMENTS

| | | | |
|---|---|---|---|
| 5,918,149 A | 6/1999 | Besser et al. | |
| 6,077,772 A | 6/2000 | Park et al. | |
| 6,077,780 A * | 6/2000 | Dubin | H01L 21/76834 257/E21.584 |
| 6,207,487 B1 | 3/2001 | Kim et al. | |
| 6,242,808 B1 | 6/2001 | Shimizu et al. | |
| 6,251,242 B1 | 6/2001 | Fu et al. | |
| 6,277,249 B1 | 8/2001 | Gopalraja et al. | |
| 6,284,646 B1 | 9/2001 | Leem | |
| 6,305,314 B1 | 10/2001 | Sneh et al. | |
| 6,335,240 B1 | 1/2002 | Kim et al. | |
| 6,344,419 B1 | 2/2002 | Forster et al. | |
| 6,348,376 B2 | 2/2002 | Lim et al. | |
| 6,358,829 B2 | 3/2002 | Yoon et al. | |
| 6,372,598 B2 | 4/2002 | Kang et al. | |
| 6,399,491 B2 | 6/2002 | Jeon et al. | |
| 6,416,822 B1 | 7/2002 | Chiang et al. | |
| 6,428,859 B1 | 8/2002 | Chiang et al. | |
| 6,451,119 B2 | 9/2002 | Sneh et al. | |
| 6,451,695 B2 | 9/2002 | Sneh | |
| 6,458,701 B1 | 10/2002 | Chae et al. | |
| 6,464,779 B1 | 10/2002 | Powell et al. | |
| 6,468,924 B2 | 10/2002 | Lee et al. | |
| 6,475,910 B1 | 11/2002 | Sneh | |
| 6,476,454 B2 | 11/2002 | Suguro | |
| 6,478,872 B1 | 11/2002 | Chae et al. | |
| 6,482,262 B1 | 11/2002 | Elers et al. | |
| 6,482,733 B2 | 11/2002 | Raaijmakers et al. | |
| 6,482,740 B2 | 11/2002 | Soininen et al. | |
| 6,489,214 B2 | 12/2002 | Kim et al. | |
| 6,511,539 B1 | 1/2003 | Raaijmakers | |
| 6,534,395 B2 | 3/2003 | Werkhoven et al. | |
| 6,548,424 B2 | 4/2003 | Putkonen | |
| 6,551,929 B1 | 4/2003 | Kori et al. | |
| 6,569,501 B2 | 5/2003 | Chiang et al. | |
| 6,585,823 B1 | 7/2003 | Van Wijck | |
| 6,599,572 B2 | 7/2003 | Saanila et al. | |
| 6,599,819 B1 | 7/2003 | Goto | |
| 6,607,958 B2 | 8/2003 | Suguro | |
| 6,607,976 B2 | 8/2003 | Chen et al. | |
| 6,620,670 B2 | 9/2003 | Song et al. | |
| 6,620,723 B1 | 9/2003 | Byun et al. | |
| 6,620,956 B2 | 9/2003 | Chen et al. | |
| 6,630,201 B2 | 10/2003 | Chiang et al. | |
| 6,632,279 B1 | 10/2003 | Ritala et al. | |
| 6,657,304 B1 | 12/2003 | Woo et al. | |
| 6,660,660 B2 | 12/2003 | Haukka et al. | |
| 6,686,271 B2 | 2/2004 | Raaijmakers et al. | |
| 6,780,777 B2 | 8/2004 | Yun et al. | |
| 6,825,115 B1 | 11/2004 | Xiang et al. | |
| 6,867,130 B1 | 3/2005 | Karlsson et al. | |
| 6,867,152 B1 | 3/2005 | Hausmann et al. | |
| 6,897,118 B1 | 5/2005 | Poon et al. | |
| 6,939,801 B2 | 9/2005 | Chung et al. | |
| 6,969,448 B1 | 11/2005 | Lau | |
| 7,148,548 B2 | 12/2006 | Doczy et al. | |
| 7,211,506 B2 | 5/2007 | Moon et al. | |
| 7,279,432 B2 | 10/2007 | Xi et al. | |
| 7,867,914 B2 | 1/2011 | Xi et al. | |
| 8,110,489 B2 | 2/2012 | Ganguli et al. | |
| 8,524,600 B2 | 9/2013 | Lei et al. | |
| 8,661,664 B2 | 3/2014 | McFeely et al. | |
| 8,728,955 B2 | 5/2014 | LaVoie et al. | |
| 8,765,601 B2 | 7/2014 | Lei et al. | |
| 8,815,724 B2 | 8/2014 | Ganguli et al. | |
| 9,051,641 B2 | 6/2015 | Lu et al. | |
| 9,209,074 B2 | 12/2015 | Lu et al. | |
| 9,330,939 B2 | 5/2016 | Zope et al. | |
| 9,392,690 B2 | 7/2016 | McFeely et al. | |
| 9,842,769 B2 | 12/2017 | Zope et al. | |
| 10,269,363 B2 | 4/2019 | Fukui et al. | |
| 2001/0025999 A1 | 10/2001 | Suguro | |
| 2001/0029094 A1 * | 10/2001 | Mee-Young | H01L 21/28562 438/597 |
| 2002/0164429 A1 | 11/2002 | Gaillard et al. | |
| 2003/0027393 A1 | 2/2003 | Suguro | |
| 2003/0059538 A1 | 3/2003 | Chung et al. | |
| 2003/0224578 A1 | 12/2003 | Chung et al. | |
| 2005/0014365 A1 | 1/2005 | Moon et al. | |
| 2005/0074956 A1 | 4/2005 | Autryve et al. | |
| 2005/0186765 A1 | 8/2005 | Ma et al. | |
| 2006/0017098 A1 | 1/2006 | Doczy et al. | |
| 2006/0079086 A1 | 4/2006 | Boit et al. | |
| 2006/0091493 A1 | 5/2006 | Wu | |
| 2006/0105515 A1 | 5/2006 | Amos et al. | |
| 2006/0105557 A1 | 5/2006 | Klee et al. | |
| 2007/0202254 A1 * | 8/2007 | Ganguli | C23C 16/18 427/252 |
| 2007/0209931 A1 | 9/2007 | Miller | |
| 2008/0014352 A1 | 1/2008 | Xi et al. | |
| 2008/0085611 A1 | 4/2008 | Khandelwal et al. | |
| 2008/0124698 A1 | 5/2008 | Ebensberger et al. | |
| 2008/0132050 A1 | 6/2008 | Lavoie | |
| 2008/0194105 A1 * | 8/2008 | Dominguez | C23C 16/18 438/681 |
| 2008/0201976 A1 | 8/2008 | Anderson | |
| 2008/0296768 A1 * | 12/2008 | Chebiam | H01L 21/76846 257/751 |
| 2009/0022958 A1 * | 1/2009 | Plombon | H01L 21/28562 428/164 |
| 2009/0053426 A1 * | 2/2009 | Lu | C23C 16/16 427/540 |
| 2009/0246952 A1 * | 10/2009 | Ishizaka | C23C 16/34 438/653 |
| 2009/0269507 A1 * | 10/2009 | Yu | H01L 21/02074 427/535 |
| 2009/0283903 A1 * | 11/2009 | Park | H04L 24/03 257/737 |
| 2010/0038786 A1 | 2/2010 | Luoh et al. | |
| 2010/0200991 A1 * | 8/2010 | Akolkar | C23C 16/045 257/751 |
| 2010/0323517 A1 * | 12/2010 | Baker-O'Neal | H01L 21/76873 438/653 |
| 2011/0124192 A1 * | 5/2011 | Ganguli | C23C 16/18 438/653 |
| 2011/0163449 A1 * | 7/2011 | Kelly | H01L 21/2885 257/750 |
| 2011/0263115 A1 | 10/2011 | Ganguli et al. | |
| 2012/0012372 A1 | 1/2012 | McFeely et al. | |
| 2012/0252207 A1 | 10/2012 | Lei et al. | |
| 2012/0264291 A1 | 10/2012 | Ganguli et al. | |
| 2013/0023116 A1 | 1/2013 | Kumamoto et al. | |
| 2013/0210241 A1 | 8/2013 | LaVoie et al. | |

(56) References Cited

U.S. PATENT DOCUMENTS

| | | |
|---|---|---|
| 2013/0260555 A1 | 10/2013 | Zope et al. |
| 2014/0151097 A1 | 6/2014 | McFeely et al. |
| 2015/0021672 A1 | 1/2015 | Chuang et al. |
| 2015/0255333 A1 | 9/2015 | Lu et al. |
| 2018/0068890 A1 | 3/2018 | Zope et al. |

FOREIGN PATENT DOCUMENTS

| | | |
|---|---|---|
| JP | 2001-131746 A | 5/2001 |
| JP | 2001-274380 A | 10/2001 |
| JP | 2009-533877 A | 9/2009 |
| JP | 2012-501543 A | 1/2012 |
| JP | 2012-109598 A | 6/2012 |
| JP | 2012-160737 A | 8/2012 |
| JP | 2013-535820 A | 9/2013 |
| KR | 100287180 | 4/2001 |
| KR | 100287180 B1 | 4/2001 |
| KR | 1020040068969 | 8/2004 |
| WO | 2010-025068 A2 | 4/2010 |
| WO | 2010-103879 A1 | 9/2010 |
| WO | 2012-010479 A1 | 1/2012 |

OTHER PUBLICATIONS

International Search Report and Written Opinion for International Application No. PCT/US2014/054989 dated Dec. 23, 2014.
Office Action for U.S. Appl. No. 14/482,601 dated Mar. 22, 2016.
Notice of Allowance for U.S. Appl. No. 14/482,601 dated Sep. 2, 2016.
Office Action for Japanese Application No. 2016-518071 dated May 1, 2018.
Search Report for Chinese Application No. 201480049063.4 dated Feb. 23, 2018.
Office Action for Japan Application No. 2019-031283 dated Dec. 23, 2019.
Search Report for Japan Application No. 2019-031283 dated Dec. 5, 2019.

* cited by examiner

METHOD OF ENABLING SEAMLESS COBALT GAP-FILL

CROSS-REFERENCE TO RELATED APPLICATIONS

This application is a continuation of U.S. patent application Ser. No. 14/482,601, filed Sep. 10, 2014, which claims benefit of U.S. provisional patent application Ser. No. 61/883,480, filed Sep. 27, 2013, both of which are herein incorporated by reference in their entirety.

BACKGROUND

Field

Implementations of the disclosure generally relate to the field of semiconductor manufacturing processes, more particularly, to methods for depositing metal containing layers in features of a semiconductor device.

Description of the Related Art

Integrated circuits may include more than one million micro-electronic field effect transistors (e.g., complementary metal-oxide-semiconductor (CMOS) field effect transistors) that are formed on a substrate (e.g., semiconductor wafer) and cooperate to perform various functions within the circuit. Reliably producing sub-half micron and smaller features is one of the key technologies for the next generation of very large scale integration (VLSI) and ultra large-scale integration (ULSI) of semiconductor devices. However, as the limits of integrated circuit technology are pushed, the shrinking dimensions of interconnects in VLSI and ULSI technology have placed additional demands on processing capabilities. Reliable formation of the gate pattern is important to integrated circuits success and to the continued effort to increase circuit density and quality of individual substrates and die.

As feature sizes have become smaller, the demand for higher aspect ratios, defined as the ratio between the depth of the feature and the width of the feature, has steadily increased to 20:1 and even greater. A variety of problems may occur when depositing metal layers into feature definitions with small geometries, such as geometries having aspect ratios of about 20:1 or smaller. For example, a metal layer deposited using a conventional PVD process often suffers from poor step coverage, overhang, and voids formed within the via or trench when the via has a critical dimension of less than 50 nm or has an aspect ratio greater than 10:1. Insufficient deposition on the bottom and sidewalls of the vias or trenches can also result in deposition discontinuity, thereby resulting in device shorting or poor interconnection formation. Furthermore, the metal layer may have poor adhesion over the underlying material layer, resulting in peeling of the metal layer from the substrate and the subsequent conductive metal layer.

With this increase in transistor density and subsequent decrease in the cross-sections of metal layers, meeting the contact resistance requirements using existing low resistivity tungsten (W) integration schemes has become quite challenging. The necessity of high-resistivity adhesion (e.g., $B_2H_6$ nucleation) and barrier layers (e.g., TiN) in the tungsten integration scheme results in increased contact resistance making it an unattractive option for technology nodes less than 22 nanometers.

Therefore, there is a need for an improved method for forming a contact metal layer in high aspect ratio features.

SUMMARY

Implementations of the disclosure generally relate to the field of semiconductor manufacturing processes, more particularly, to methods for depositing a metal layer in structures of a semiconductor device. In one implementation, a method for depositing a metal layer for forming a semiconductor device is provided. The method comprises performing a cyclic metal deposition process to deposit a metal layer in a feature definition formed in a substrate, comprising exposing the substrate to a deposition precursor gas mixture to deposit a portion of the metal layer in the feature definition, exposing the portion of the metal layer to either a plasma treatment process or a hydrogen annealing process, repeating the exposing the substrate to a deposition precursor gas mixture and the exposing the portion of the metal layer to either a plasma treatment process or a hydrogen annealing process until a predetermined thickness of the metal layer is achieved and annealing the metal layer.

In another implementation, a method for depositing a metal layer for forming a semiconductor device is provided. The method comprises performing a barrier layer deposition process to deposit a barrier layer in a feature definition formed in a substrate, performing a wetting layer deposition to deposit a wetting layer on the barrier layer, performing a cyclic metal deposition process to deposit a metal layer on the wetting layer, and annealing the metal layer. The cyclic metal deposition process comprises exposing the substrate to a deposition precursor gas mixture to deposit a portion of the metal layer in the feature definition, exposing the portion of the metal layer to either a plasma treatment process or a hydrogen annealing process, and repeating the exposing the substrate to a deposition precursor gas mixture and exposing the portion of the metal layer to either a plasma treatment process or a hydrogen annealing process until a predetermined thickness of the metal layer is achieved.

In yet another implementation, a method for depositing a metal layer for forming a semiconductor device is provided. The method comprises performing a barrier layer deposition process to deposit a barrier layer in a feature definition formed in a substrate, performing a wetting layer deposition process to deposit a wetting layer on the barrier layer, performing an annealing process on the wetting layer, performing a metal deposition process to deposit a metal layer on the wetting layer by exposing the wetting layer to a deposition precursor gas mixture to deposit a portion of the metal layer, exposing the portion of the metal layer to a either a plasma treatment process or a hydrogen annealing process, and annealing the metal layer.

BRIEF DESCRIPTION OF THE DRAWINGS

So that the manner in which the above-recited features of the present disclosure can be understood in detail, a more particular description of the implementations, briefly summarized above, may be had by reference to implementations, some of which are illustrated in the appended drawings. It is to be noted, however, that the appended drawings illustrate only typical implementations of this disclosure and are therefore not to be considered limiting of its scope, for the disclosure may admit to other equally effective implementations.

Figure 1:
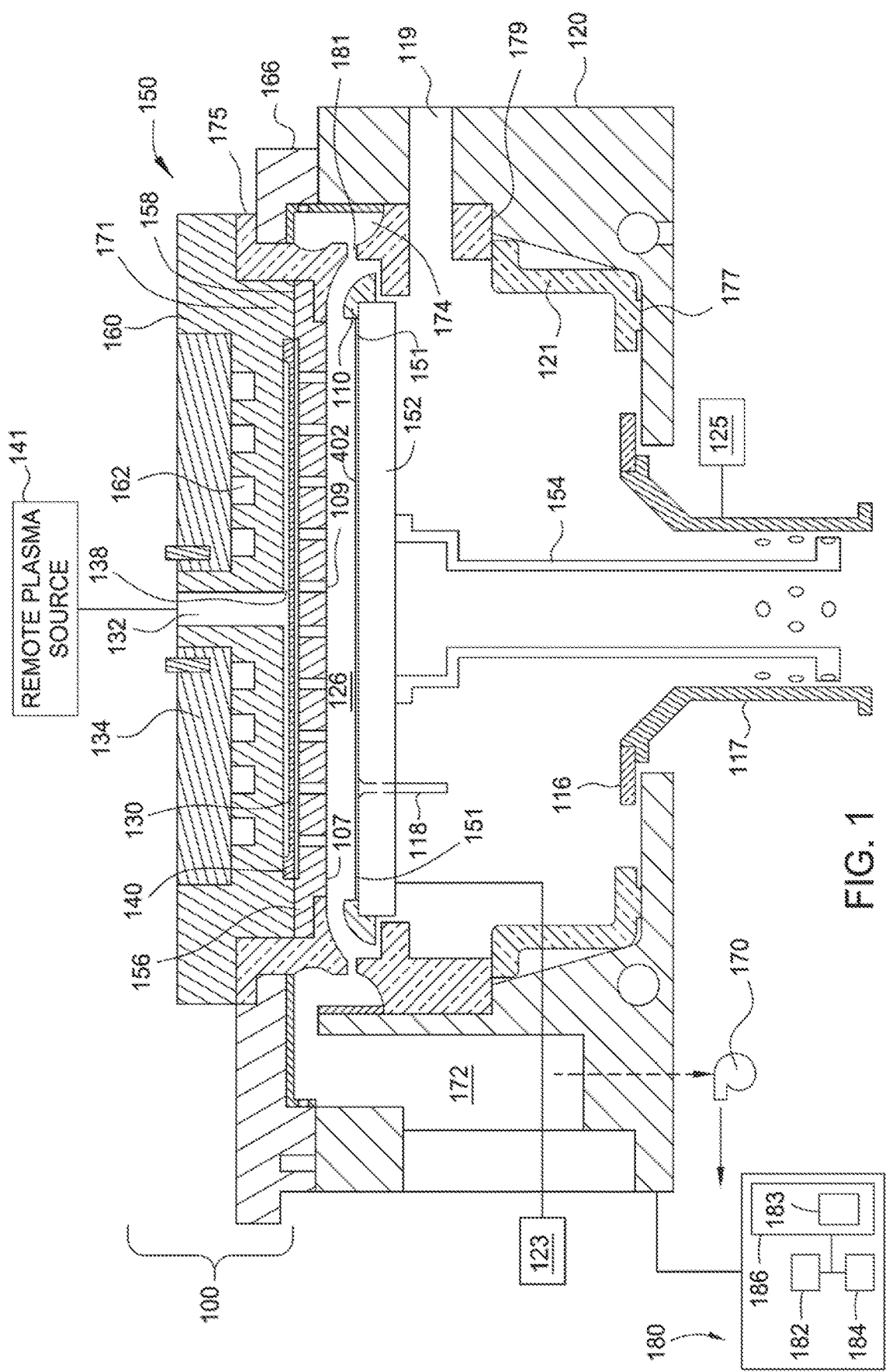
FIG. 1 depicts a sectional view of one implementation of a metal deposition processing chamber suitable for performing implementations described herein.

To facilitate understanding, identical reference numerals have been used, where possible, to designate identical elements that are common to the figures. It is contemplated that elements and features of one implementation may be beneficially incorporated in other implementations without further recitation. It is to be noted, however, that the appended drawings illustrate only exemplary implementations of this disclosure and are therefore not to be considered limiting of its scope, for the disclosure may admit to other equally effective implementations.

DETAILED DESCRIPTION

The increase in transistor density combined with the shrinking technology nodes (≤11 nm) of advanced CMOS transistors has resulted in decrease in the cross-section dimensions of conducting metal layers utilized during semiconductor manufacturing. Examples of such metal conducting layers include metal contact fill, metal gate fill and interconnect fill. Very narrow cross-section dimensions (<20 nm) for these application necessitates a metal fill technology without the need of thick (>2 nm) high resistivity barrier layers. Gap-fill methods utilizing CVD cobalt processes provide a potential low contact resistance (Rc) one-material solution for gap-fill. The CVD cobalt films are required to have conformal step coverage and low roughness. Certain implementations described herein demonstrate a process to fill conducting layer holes or trenches of a semiconductor device with no seam formation.

In some implementations, the purity of the cobalt film was found to govern cobalt seamless fill. The atomic % of carbon, nitrogen and oxygen impurities in the CVD cobalt film may be controlled through process temperature, process gases, cyclic plasma treatment ($H_2$, $N_2$, etc.) and post-deposition anneal conditions (in Ar or $H_2$ or combination thereof). The re-flow characteristic of CVD cobalt film may be regulated by controlling atomic % of impurities through above-mentioned process variables. The impurities may be in the form of carbon, oxygen, nitrogen, etc. In some implementations, 1% or lower carbon impurity level was preferable for enabling seamless cobalt gap-fill.

In some implementations, cyclic $H_2$ plasma treatment of CVD cobalt layer was used to reduce roughness and carbon % of the deposited films. Thus, H* radical lifetime, especially inside the narrow (e.g., <15 nm CD and >5 aspect ratio) via and trench structures expected for transistor technology node≤14 nm, was an important parameter to enable seamless and void-free cobalt gap-fill. In some implementations, increasing the frequency of the plasma treatment during CVD cobalt deposition allowed for void-free cobalt gap-fill. The life time of H* radical inside the CVD chamber may be improved by flowing an inert, stable gas (such as helium, neon, argon, etc.) during plasma treatment step or by using an inductively coupled plasma source or microwave plasma source or e-beam plasma source. Alternatively, $H_2$ purge at pressures (15-60 Torr) can be utilized in place of $H_2$ plasma. This is especially useful if short H* radical lifetime does not allow H* radical to reach to the bottom of high aspect ratio (e.g., for >10:1) features.

In some implementations, cobalt was deposited using dicobalt hexacarbonyl tertbutyl acetylene (CCTBA) precursors in chemical vapor deposition (CVD) mode. However, alternate cobalt precursors can also be used to deposit cobalt film layers in either chemical vapor deposition or atomic layer deposition (ALD) mode. Some of the cobalt precursors that may be used include cobalt amidinate, cyclopentadienyl cobalt dicarbonyl, cobalt carbonyl, cobalt diazadienyl complexes, cobalt tricarbonyl nitrosyl, cobalt acetylacetonate, cobalt hexafluoroacetylacetonate, cobalt hydride complexes, cobalt (II) acetate, and cobalt (II) acetylacetonate. In addition, the annealing step may be combined with CVD or ALD deposition by using process temperatures in the range of 200-500° C. and in presence of process gas such as Ar or $H_2$.

Instead of CVD and ALD deposition of cobalt, physical vapor deposition (PVD) may also be used for seamless gap-fill of cobalt. Similar to the process described above, a cyclic PVD cobalt deposition and annealing process can be used for seamless filling of the feature definition. Alternatively, high temperature (200-500° C.) PVD cobalt deposition in the presence of a process gas such as Ar or $H_2$ may be used. Since PVD is a 'line of sight' deposition process, a wetting layer may be preferable for PVD cobalt reflow. The wetting layer may be any of MO TiN, CVD cobalt, CVD Ru, ALD TaN. Alternatively, the PVD cobalt layer deposited at the bottom of the feature may be etched and re-sputtered on the sidewall of the feature definition to provide a continuous cobalt film on the sidewall allowing for re-flow of PVD cobalt from the field to the bottom of the feature definition.

In some implementations, the re-flow of cobalt films may be enabled using an integrated anneal (with no vacuum break) in the dual mode degas chamber. In some implementations, the re-flow of cobalt films may be achieved by annealing after vacuum break. In some implementations, an anneal temperature of 300-400° C. may be preferable for enabling seamless gap-fill. However, a range of temperature such as 200-500° C. may be used. In some implementations, annealing in an ambient of $H_2$ improved cobalt seamless fill. Other ambient such as $H_2$ mixed with inert as well as pure inert (Ar or $N_2$) may be used for annealing. Other anneal variables include anneal time and anneal state (flow or static).

Potential applications of the implementations described herein include metal-gate fill, interconnect fill and contact fill. Certain implementations described herein enable use of cobalt as pMOS work-function metal as well as metal gate fill material by allowing for low-resistivity seamless cobalt fill. Incumbent metal gate fill material (tungsten) requires thick (>2 nm) TiN barrier and high resistivity tungsten-nucleation layer prior to tungsten deposition.

Certain implementations described herein may be utilized to fill vias and/or trenches of the interconnect structures with cobalt utilizing no or thin (≤1 nm) TiN barrier layer. Conventional copper fill integration scheme requires thick (>2 nm) barrier layers (such as Ta and TaN) prior to copper fill.

Certain implementations described herein may be utilized to fill contact vias and trenches with cobalt utilizing a thin (1 nm) TiN barrier to stop cobalt diffusion in the semiconductor junction substrate.

Implementations of the present disclosure provide gap-fill utilizing metallic CVD and PVD processes (e.g., cobalt CVD and PVD processes) resulting in a potential low contact resistance (Rc) one-material solution for metal filling of feature definitions. The metal layers deposited according to implementations described herein may be used as a work function material, a metal gate fill, a metal contact fill, and an interconnect fill. Exemplary feature definitions include feature definitions such as vias, trenches, lines, contact holes, or other feature definitions utilized in a semiconductor, solar, or other electronic devices, such as high aspect contact plugs. The CVD and PVD films deposited according to implementations described herein have conformal step coverage and low surface roughness. Further, the implementations demonstrated herein demonstrate a process for filling feature definitions of a semiconductor device with no seam formation.

In one implementation, a method for depositing a metal layer over a substrate is provided which includes exposing the substrate to a cobalt precursor gas and hydrogen gas to selectively form a portion of a seamless gap fill cobalt layer within a feature definition, and exposing the cobalt layer to a plasma and a reagent, such as nitrogen, ammonia, hydrogen, an ammonia/nitrogen mixture, or combinations thereof during a post-treatment process.

As used herein, the term high-k dielectric material includes a dielectric material having a dielectric constant greater than 10. Suitable high-k dielectric materials include a dielectric material having a dielectric constant of 25 or greater. One class of high-k dielectric material that may be used includes one or more oxide materials. Examples of suitable oxide materials include hafnium oxide, hafnium silicate, hafnium silicon oxynitride, aluminates thereof, or derivatives thereof or combinations thereof. Other oxide materials include lanthanum oxide, lanthanum silicate, zirconium oxide, zirconium silicate, or combinations thereof. Each of the one or more oxide materials may also be doped with a material selected from the group of zirconium, lanthanum, cerium, titanium, or combinations thereof.

As used herein, the term "substrate" refers to a layer of material that serves as a basis for subsequent processing operations and includes a surface to be disposed for forming a metal layer thereon. The substrate may be a material such as crystalline silicon (e.g., Si<100> or Si<1111>), silicon oxide, strained silicon, silicon germanium, doped or undoped polysilicon, doped or undoped silicon wafers, patterned or non-patterned wafers silicon on insulator (SOI), carbon doped silicon oxides, silicon nitride, doped silicon, germanium, gallium arsenide, glass, or sapphire. The substrate may comprise dielectric materials such as silicon dioxide ($SiO_2$), or a high-k dielectric material having a dielectric constant greater than 4.0, such as SiON, SiN, hafnium oxide ($HfO_2$), hafnium silicate ($HfSiO_2$), hafnium silicon oxynitride (HfSiON), zirconium oxide ($ZrO_2$), zirconium silicate ($ZrSiO_2$), barium strontium titanate ($BaSrTiO_3$, or BST), lead zirconate titanate ($Pb(ZrTi)O_3$, or PZT), and the like. The substrate can also include one or more nonconductive materials, such as silicon, silicon oxide, doped silicon, germanium, gallium arsenide, glass, and sapphire. The substrate can also include dielectric materials such as silicon dioxide, organosilicates, and carbon doped silicon oxides. Further, the substrate can include any other materials such as metal nitrides and metal alloys, depending on the application.

As used herein, the term "work function" is a material property, measured in electron volts (eV), which represents the amount of energy needed to remove an electron from a solid to a point outside the solid surface or the energy needed to move an electron from the Fermi level into a vacuum. In practice, the work function value is the amount of energy needed to move the metal electron from the metal to the high-k material. It is believed that the value is close to the ideal work function and may sometimes vary due to the structure of the metal that is deposited on the dielectric material. For a metal, the work function is a constant, and for a semiconductor material, the work function can be modified by the addition of other materials, such as boron or phosphorus, generally considered dopant materials. A transistor's threshold voltage may be modified when using materials having different desired work functions in a metal gate electrode structure.

As used herein, the term "work function material" refers to a material having work function material properties and used to form the desired properties, such as electrical properties, of a gate electrode in a transistor structure. The work function material may be disposed on or adjacent to a high-k dielectric material to provide the most effect of the work function material's properties on the metal gate electrode structure of a transistor. The work function required will depend on the high-k material and the doping type and amount of the source, drain, and gate. Thus, the composition of the work function metal may need to be varied to achieve the desired amount. The work function of N-metal planar gate structures should typically be equal to or less than 4.3 eV, whereas the work function for non-planar gate structures such as FinFET gate structures, where higher doping is acceptable, may be equal to or less than 4.4 eV. The work function for a given circuit design depends on the amount of doping allowed.

The work function material may be a metal, metal carbide, metal silicide, metal carbide silicide, metal carbide nitride, or metal boride material described herein and deposited by the processes described herein. Additionally, the metal, metal carbide, metal silicide, metal carbide silicide, metal carbide nitride, or metal boride materials may contain other conductive materials, such as aluminum. Suitable work function materials include a material selected from the group of tantalum, hafnium, titanium, lanthanum, tantalum carbide, hafnium carbide, titanium carbide, lanthanum carbide, hafnium silicides, tantalum silicides, titanium silicides, lanthanum silicides, tantalum carbide silicide, hafnium carbide silicide, titanium carbide silicide, lanthanum carbide silicide, hafnium aluminide carbide, tantalum aluminide carbide, lanthanum aluminide carbide, tantalum carbide nitride, tantalum aluminide nitride, lanthanum boride, hafnium boride, or combinations thereof. Additionally, the work function material may be deposited, for example, to a thickness of about 20 Å or more, such as from about 20 Å to about 80 Å, for example, about 30 Å thick.

In one or more implementations, the substrate can form a gate structure including a gate dielectric layer and a gate electrode layer to facilitate connecting with an interconnect feature definition, such as a plug, via, contact, line, and wire, subsequently formed thereon. The substrate may have various dimensions, such as 200 mm, 300 mm, or 450 mm diameter wafers or other dimensions, as well as rectangular or square panels. Unless otherwise noted, implementations and examples described herein may be conducted on substrates with a 200 mm diameter, a 300 mm diameter, or a 450 mm diameter, particularly a 300 mm diameter.

As used herein, the term "contact structure" refers to a layer of material that includes a contact metal layer that can form part of a gate electrode. In one or more implementations, the contact metal layer can be nickel layer, cobalt layer, titanium layer or any combinations thereof.

Moreover, the substrate is not limited to any particular size or shape. The substrate can be a round wafer having a 200 mm diameter, a 300 mm diameter or other diameters, such as 450 mm, among others. The substrate can also be any polygonal, square, rectangular, curved or otherwise non-circular workpiece, such as a polygonal glass substrate used in the fabrication of flat panel displays.

Implementations described herein provide methods for depositing/forming a metal layer within a feature definition to form a metal structure. The deposition process may efficiently improve deposited film step coverage, conformality, and continuity and uniformity across the substrate, thereby improving the overall film properties formed across the substrate.

FIG. 1 illustrates a processing chamber 150 that may be used to form metal materials by vapor deposition processes as described herein. The metal materials may contain metallic cobalt, metallic nickel, derivatives thereof, or combinations thereof. The processing chamber 150 may be used to perform CVD, plasma enhanced-CVD (PE-CVD), pulsed-CVD, ALD, PE-ALD, derivatives thereof, or combinations thereof. The processing chamber 150 may be used to anneal previously deposited metal layers. Thus, both the deposition processes and the subsequent annealing may be performed in-situ in the same processing chamber. Water channels, such as a convolute liquid channel 162, may be used to regulate the temperature of a lid assembly 100 during the vapor deposition process for depositing a cobalt-containing material. In one implementation, the lid assembly 100 may be heated or maintained at a temperature within a range from about 100° C. to about 300° C., preferably, from about 125° C. to about 225° C., and more preferably, from about 150° C. to about 200° C. The temperature may be maintained during the vapor deposition process of a cobalt-containing material and/or nickel containing material.

A showerhead 156 has a relatively short upwardly extending rim 158 coupled with a gas box plate 160. Both the showerhead 156 and the gas box plate 160 may be formed from or contain a metal, such as aluminum, stainless steel, or alloys thereof. The convolute liquid channel 162 is formed in the top of the gas box plate 160 and covered and sealed by a water cooling cover plate 134. Water is generally flown through the convolute liquid channel 162. However, alcohols, glycol ethers, and other organic solvents may be used solely or mixed with water to transfer heat away from or to the lid assembly 100. The convolute liquid channel 162 is formed in a serpentine though generally circumferential path having bends (e.g., three sharp U-turns or U-shaped bends) as the path progresses from the inside to the outside until the path returns to the inside in a radial channel (not shown). The convolute liquid channel 162 is narrow enough to ensure that the flow of water becomes turbulent, thus aiding the flow of heat from the flange of the gas box plate 160 to the water in the convolute liquid channel 162. A liquid temperature regulating system (not shown) may be attached to the convolute liquid channel 162 and used to transfer heat away from or to lid assembly 100. In one example, the lid assembly 100 is configured to be heated or maintained at a temperature of about 150° C. and is in fluid communication with a source of a cobalt precursor, such as dicobalt hexacarbonyl butylacetylene "CCTBA," and a source of a hydrogen precursor, such as $H_2$.

The extending rim 158 of the showerhead 156 is attached to the bottom rim 171 of the gas box plate 160. Both rims 158 and 171 are maximally sized between encompassing a lid isolator 175 and an encompassed lower cavity 130 of the showerhead 156. A screw fastening between the showerhead 156 and the gas box plate 160 ensures good thermal contact over the maximally sized contact area. The thermal flow area extends from the outside at the lid isolator 175 (except for a gap between the lid isolator 175 and either the showerhead 156 or the gas box plate 160) to the inside at a lower cavity 130. The structure of the convolute liquid channel 162 provides efficient thermal transfer between the water and the gas box plate 160. The mechanical interface between the flange of gas box plate 160 and showerhead 156 ensures efficient thermal transfer between the gas box plate 160 and the showerhead 156. Accordingly, cooling of the showerhead 156 is greatly enhanced.

The processing chamber 150 further contains a heater pedestal 152 connected to a pedestal stem 154 that may be vertically moved within the processing chamber 150. The heater portion of the heater pedestal 152 may be formed of a ceramic material. In its upper deposition position, the heater pedestal 152 holds a substrate 402 in close opposition to a lower surface 107 of the showerhead 156. A processing region 126 is defined between the heater pedestal 152 and the lower surface 107 of the showerhead 156. The showerhead 156 has a plurality of apertures or holes 109 communicating between the lower cavity 130 and the processing region 126 to allow for the passage of processing gas. The processing gas is supplied through the gas port 132 formed at the center of the water-cooled gas box plate 160 which is made of aluminum. The upper side of the gas box plate 160 is covered by a water-cooling cover plate 134 surrounding the upper portion of the gas box plate 160 that includes a gas port 132. The gas port 132 supplies the processing gases to an upper cavity 138, which is separated from the lower cavity 130 by a blocker plate 140. The blocker plate 140 has a large number of holes 109 disposed therethrough. In one implementation, the cavities 130 and 138, showerhead 156, and blocker plate 140 evenly distribute the processing gas over the upper face of the substrate 402.

The substrate 402 may be supported on the heater pedestal 152, which is illustrated in a raised, deposition position. In a lowered, loading position, a lifting ring 116 is attached to a lift tube 117, which lifts four lift pins 118. The lift pins 118 fit to slide into the heater pedestal 152 so that the lift pins 118 can receive the substrate 402 loaded into the chamber through a loadlock port 119 in a chamber body 120. In one implementation, the heater pedestal 152 may contain an optional confinement ring 110, such as during plasma-enhanced vapor deposition processes.

A side purge gas source 123 may be coupled to the processing chamber 150 and configured to supply purge gas to an edge portion 151 of the substrate 402 as needed. In one implementation, the gases may be supplied from the side purge gas source 123 to the substrate 402 edge portion 151. The gasses may be a hydrogen gas, argon gas, nitrogen gas, helium gas, combinations thereof, or the like. Furthermore, a bottom purge gas source 125 may also be coupled to the processing chamber 150 to supply the purge gas from the bottom of the processing chamber 150 to the substrate 402 surface. Similarly, the purge gas supplied from the bottom purge gas source 125 may include a hydrogen gas, argon gas, nitrogen gas, helium gas, combinations thereof, or the like.

A lid isolator 175 is interposed between showerhead 156 and a lid rim 166, which can be lifted off the chamber body 120 to open the processing chamber 150 for maintenance access. The vacuum within the processing chamber 150 is maintained by a vacuum pump 170 connected to a pump plenum 172 within the processing chamber 150, which connects to an annular pumping channel 174.

An annular chamber liner 179 made of quartz is disposed in the processing chamber 150 which defines a side of the annular pumping channel 174 but also partially defines a further choke aperture 181 disposed between the processing region 126 and the annular pumping channel 174. The annular chamber liner 179 also supports the confinement ring 110 in the lowered position of the heater pedestal 152. The chamber liner 179 also surrounds a circumference at the back of the heater pedestal 152. The chamber liner 179 rests on a narrow ledge in chamber body 120, but there is little other contact, to minimize thermal transport. Below the chamber liner 179 is located a lower chamber shield 121, made of opaque quartz. The lower chamber shield 121 may be a z-shaped chamber shield. The lower chamber shield 121 rests on the bottom of chamber body 120 on an annular boss 177 formed on the bottom of the lower chamber shield 121. The quartz prevents radiative coupling between the bottom of the heater pedestal 152 and the chamber body 120. The annular boss 177 minimizes conductive heat transfer to the chamber body 120. In an alternative implementation, the lower chamber shield 121 includes an inwardly extending bottom lip joined to a conically shaped upper portion conforming to the inner wall of chamber body 120. While this alternative design is operationally satisfactory, the sloping shape is much more expensive to fabricate in quartz.

In one implementation, a remote plasma source 141 may be coupled to the processing chamber 150 through a gas port 132 to supply reactive plasma from the remote plasma source 141 through the plurality of holes 109 in the showerhead 156 to the processing chamber 150 to the substrate 402 surface. It is noted that the remote plasma source 141 may be coupled to the processing chamber 150 in any suitable position to supply a reactive remote plasma source to the substrate 402 surface as needed. Suitable gases that may be supplied to the remote plasma source 141 to be dissociated and further delivered to the substrate 402 surface include hydrogen, argon, helium, nitrogen, ammonia, combinations thereof and the like.

In FIG. 1, a control unit 180 may be coupled to the processing chamber 150 to control processing conditions. The control unit 180 comprises a central processing unit (CPU) 182, support circuitry 184, and memory 186 containing associated control software 183. The control unit 180 may be one of any form of a general purpose computer processor that can be used in an industrial setting for controlling various chambers and sub-processors. The CPU 182 may use any suitable memory 186, such as random access memory, read only memory, floppy disk drive, compact disc drive, hard disk, or any other form of digital storage, local or remote. Various support circuits may be coupled to the CPU 182 for supporting the processing chamber 150. The control unit 180 may be coupled to another controller that is located adjacent individual chamber components. Bi-directional communications between the control unit 180 and various other components of the processing chamber 150 are handled through numerous signal cables collectively referred to as signal buses, some of which are illustrated in FIG. 1.

Figure 2:
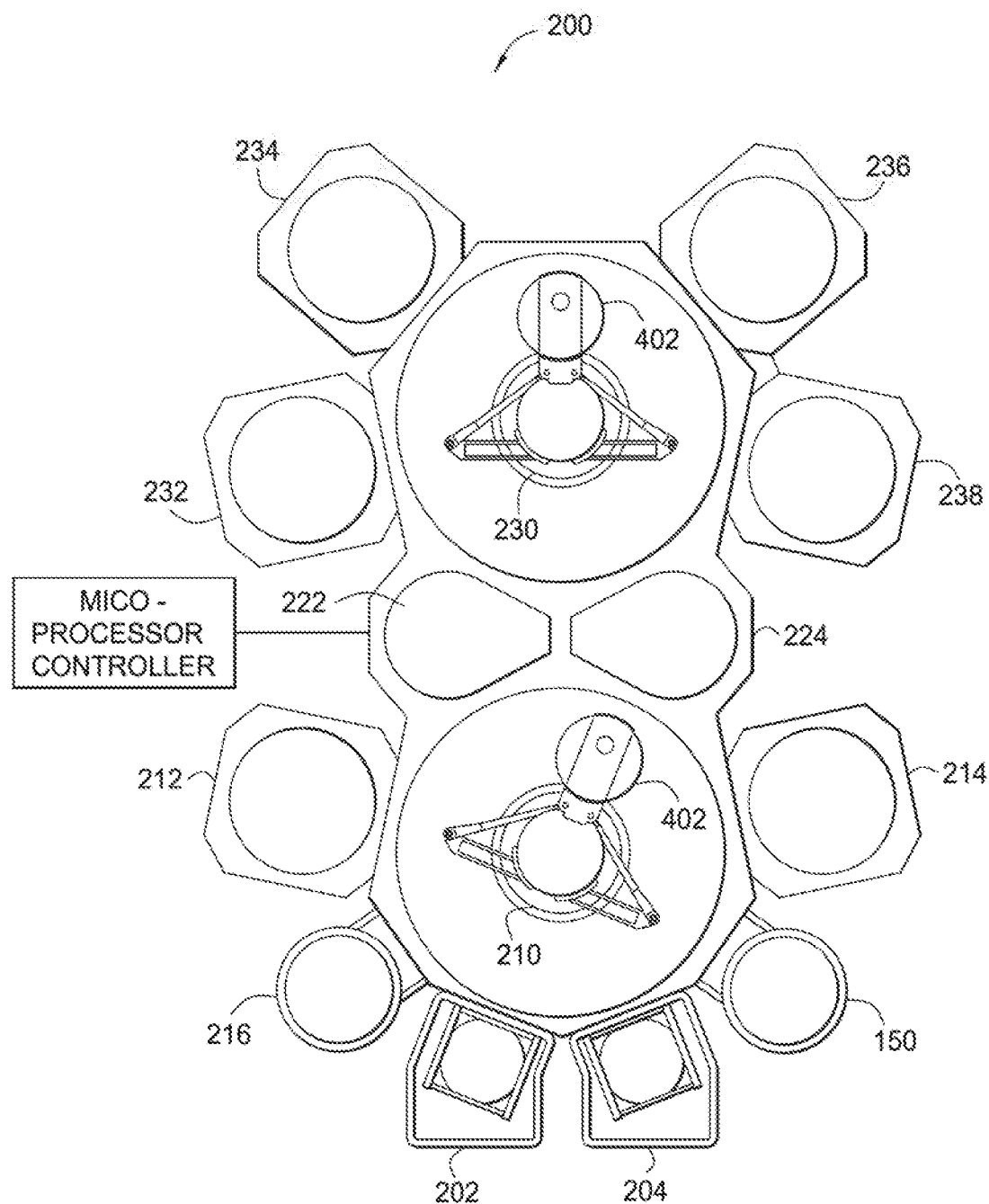
FIG. 2 depicts a schematic top-view diagram of an illustrative multi-chamber processing system having the metal deposition processing chamber of FIG. 1 incorporated therein.

FIG. 2 is a schematic top view diagram of an illustrative multi-chamber processing system 200 that can be adapted to perform a metal layer deposition process as disclosed herein having a processing chamber 150 as described above in reference to FIG. 1, integrated therewith. The system 200 can include one or more load lock chambers 202 and 204 for transferring substrate 402 into and out of the system 200. Generally, the system 200 is maintained under vacuum and the load lock chambers 202 and 204 can be "pumped down" to introduce substrate 402 introduced into the system 200. A first robot 210 can transfer the substrate 402 between the load lock chambers 202 and 204, and a first set of one or more substrate processing chambers 212, 214, 216, and 150. Each processing chamber 212, 214, 216, and 150 is configured to be at least one of a substrate deposition process, such as cyclical layer deposition (CLD), atomic layer deposition (ALD), chemical vapor deposition (CVD), physical vapor deposition (PVD), etch, degas, pre-cleaning orientation, anneal, and other substrate processes. Furthermore, one of the processing chambers 212, 214, 216, and 150 may also be configured to perform a pre-clean process prior to performing a deposition process or a thermal annealing process on the substrate 402. The position of the processing chamber 150 utilized to perform a thermal annealing process relative to the other chambers 212, 214, 216 is for illustration, and the position of the processing chamber 150 may be optionally be switched with any one of the processing chambers 212, 214, 216 if desired.

The first robot 210 can also transfer substrate 402 to/from one or more transfer chambers 222 and 224. The transfer chambers 222 and 224 can be used to maintain ultrahigh vacuum conditions while allowing substrate 402 to be transferred within the system 200. A second robot 230 can transfer the substrate 402 between the transfer chambers 222 and 224 and a second set of one or more processing chambers 232, 234, 236 and 238. Similar to the processing chambers 212, 214, 216, and 150, the processing chambers 232, 234, 236, and 238 can be outfitted to perform a variety of substrate processing operations including the dry etch processes described herein in addition to cyclical layer deposition (CLD), atomic layer deposition (ALD), chemical vapor deposition (CVD), physical vapor deposition (PVD), etch, pre-clean, degas, and orientation, for example. Any of the substrate processing chambers 212, 214, 216, 232, 234, 236, and 238 can be removed from the system 200 if not necessary for a particular process to be performed by the system 200. After the preclean, deposition and/or a thermal annealing process is performed in the processing chamber 150, the substrate may further be transferred to any of the processing chambers 212, 214, 216, 232, 234, 236, and 238 of the system 200 to perform other process as needed.

Figure 3:
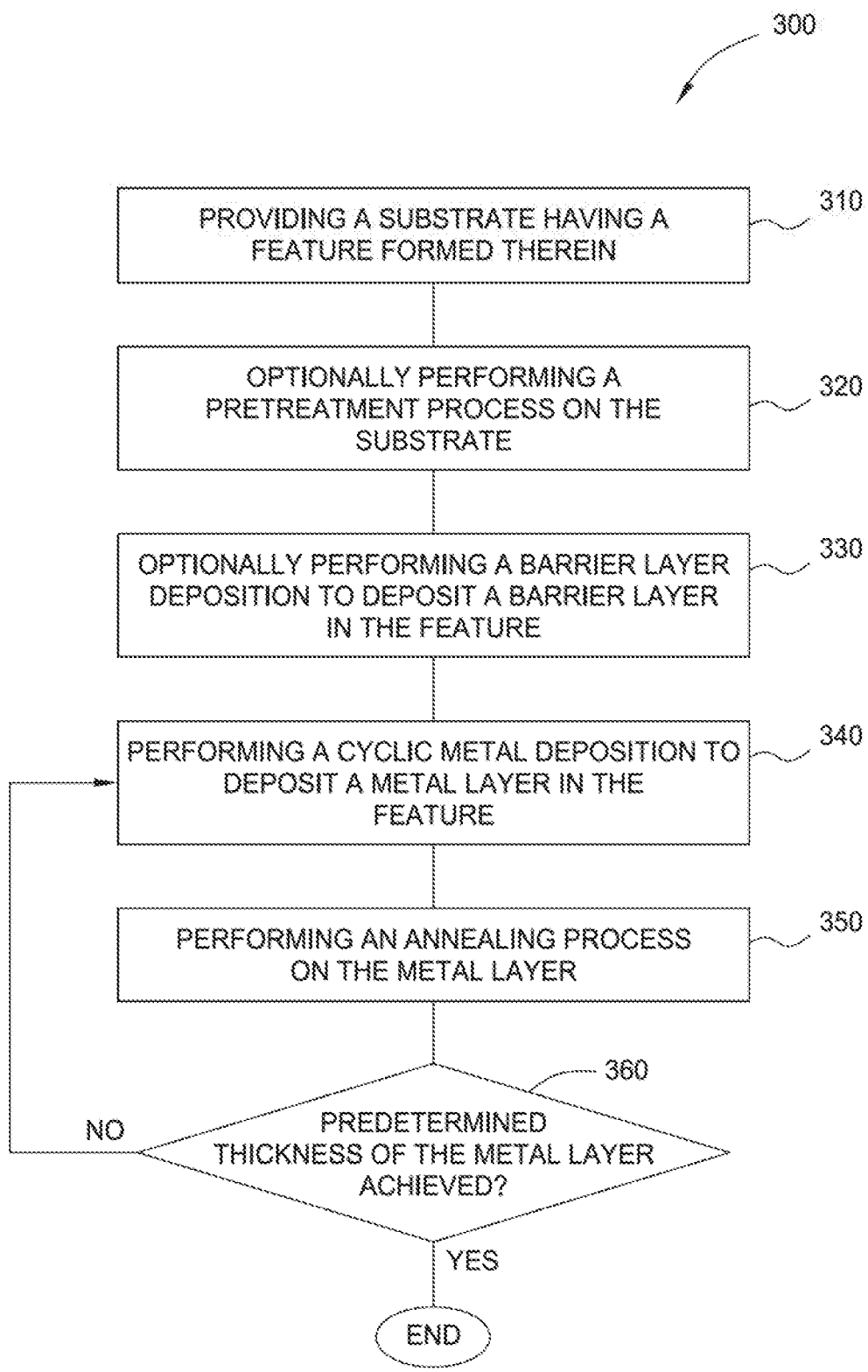
FIG. 3 depicts a flow diagram for forming a metal layer in a semiconductor device in accordance with certain implementations described herein.

FIG. 3 illustrates a flow diagram of one implementation of a processing sequence 300 used to deposit a metal layer within a feature definition of a semiconductor device structure on a substrate. The sequence described in FIG. 3 corresponds to the fabrication stages depicted in FIGS. 4A-4E, which are discussed below. FIGS. 4A-4E illustrate schematic cross-sectional views of a substrate 402 having a device structure 408 formed thereon during different stages of fabricating a metal layer 420 within a feature definition of the device structure 408 illustrated by the processing sequence 300. The sequence of FIG. 3 is generally provided with reference to a CVD, ALD, or PVD deposited cobalt metal layer.

Possible integration schemes include but are not limited to: (a) PVD Ti+ALD TiN; (b) PVD Ti+CVD Co; (c) CVD Co; and (d) CVD Co+PVD Co. PVD Ti provides good electrical contact with underlying silicide at source or drain. ALD TiN improves adhesion of the cobalt film, if needed to help re-flow of the cobalt film. CVD Co: cobalt fill using CVD films or CVD followed by re-flow.

Figure 4A:
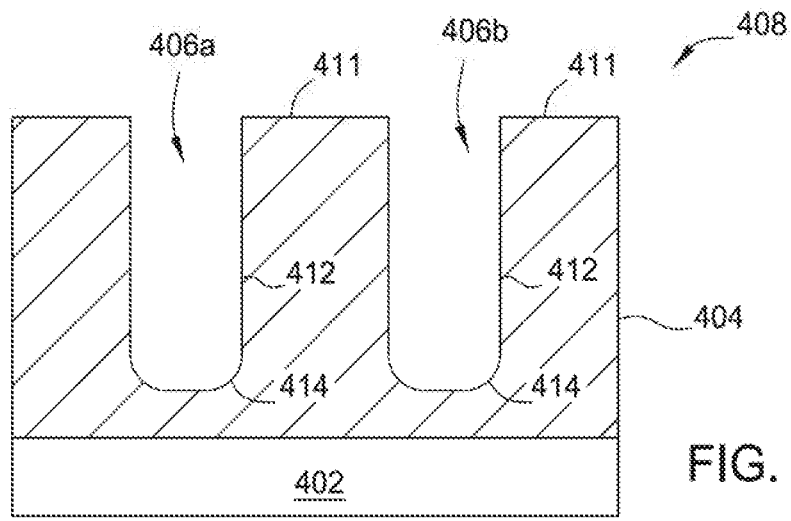
FIGS. 4A-4E depict cross-sectional views of a semiconductor device during the formation of a metal layer manufacture process in accordance with one implementation of the present disclosure.

The processing sequence 300 starts at block 310 by providing a substrate having a feature definition formed within, such as the substrate 402 having feature definitions 406a, 406b (collectively 406) formed therein as depicted in FIG. 4A, into the processing chamber, such as the substrate 402 disposed in the processing chamber 150 depicted in FIG. 1, or other suitable processing chamber. The substrate 402 shown in FIG. 4A includes a semiconductor device structure 408 (e.g., such as a contact structure, a gate structure or an interconnect structure) formed on the substrate 402. It is noted that this particular device structure 408 may be used in three-dimensional (3-D) flash memory applications, DRAM applications, or other suitable applications with high aspect ratio or other odd geometries.

A layer 404 is formed on the substrate 402 having feature definitions 406a, 406b formed therein with high aspect ratios, such as aspect ratios greater than 10:1, for example about greater than 20:1. The feature definitions 406a, 406b are formed in the device structure 408 and have sidewalls 412 and a bottom 414 which form an open channel to expose the underlying layer 404. The layer 404 may include any suitable layers such as a single silicon layer, high-k dielectric layer, low-k dielectric layer or a multiple layer film stack having at least one of the aforementioned layers formed therein. In the implementation wherein the layer 404 is in the form of a single layer, the layer 404 may be a silicon oxide layer, an oxide layer, a silicon nitride layer, a nitride layer, a silicon oxynitride layer, a titanium nitride layer, a polysilicon layer, a microcrystalline silicon layer, a monocrystalline silicon, a doped polysilicon layer, a doped microcrystalline silicon layer, or a doped monocrystalline silicon.

In another example, where layer 404 is a silicon containing layer, the layer 404 may be a film stack including a composite oxide and nitride layer, at least one or more oxide layers sandwiching a nitride layer, and combinations thereof. Suitable dopants doped in the silicon containing layer 404 may include p-type dopants and n-type dopants, such as boron (B) containing dopants or phosphine (P) containing dopants. In one implementation wherein the layer 404 is in form of a multiple film stack having at least one silicon containing layer, the silicon containing layer 404 may include repeating pairs of layers including a silicon containing layer and a dielectric layer. In one implementation, the layer 404 may include a polysilicon layer and/or other metal materials and/or a dielectric layer disposed therein. Suitable examples of the dielectric layer may be selected from a group consisting of an oxide layer, silicon oxide layer, a silicon nitride layer, a nitride layer, titanium nitride layer, a composite of oxide and nitride layer, at least one or more oxide layers sandwiching a nitride layer, and combinations thereof, among others.

Prior to transferring the substrate 402 into the metal deposition processing chamber described at block 310, a pre-cleaning process is optionally performed to treat the substrate surface 411, sidewalls 412 and bottoms 414 of the feature definitions 406a, 406b to remove native oxides or other sources of contaminants. Removal of native oxides or other sources of contaminants from the substrate 402 may provide a low contact resistance surface to form a good contact surface for forming a metal layer.

The pre-cleaning process performed includes supplying a pre-cleaning gas mixture into a pre-cleaning chamber. The pre-cleaning chamber may be a Preclean PCII, PCXT or SICONI™ chambers, which are available from Applied Materials, Inc., Santa Clara, Calif. The pre-cleaning chamber may be incorporated in the illustrative multi-chamber processing system 200 and may be configured to be one of the processing chambers 212, 214, 216, 232, 234, 236, 238 of the system 200 as needed. It is noted that other pre-cleaning chambers available from other manufactures may also be utilized to practice the implementations described herein.

The pre-cleaning process is performed by supplying a cleaning gas mixture into the pre-cleaning processing chamber incorporated in the system 200 to form a plasma from the pre-cleaning gas mixture for removing the native oxide. In one implementation, the pre-cleaning gas mixture used to remove native oxides is a mixture of ammonia ($NH_3$) and nitrogen trifluoride ($NF_3$) gases. The amount of each gas introduced into the processing chamber may be varied and adjusted to accommodate, for example, the thickness of the native oxide layer to be removed, the geometry of the substrate being cleaned, the volume capacity of the plasma, the volume capacity of the chamber body, as well as the capabilities of the vacuum system coupled to the chamber body.

In one or more implementations, the gases added to provide a pre-cleaning gas mixture having at least a 1:1 molar ratio of ammonia ($NH_3$) to nitrogen trifluoride ($NF_3$). In one or more implementations, the molar ratio of the pre-cleaning gas mixture is at least about 3:1 (ammonia to nitrogen trifluoride). The gases are introduced at a molar ratio of from about 5:1 (ammonia to nitrogen trifluoride) to about 30:1. In yet another implementation, the molar ratio of the gas mixture is from about 5:1 (ammonia to nitrogen trifluoride) to about 10:1. The molar ratio of the pre-cleaning gas mixture can also fall between about 10:1 (ammonia to nitrogen trifluoride) and about 20:1.

A purge gas or carrier gas can also be added to the pre-cleaning gas mixture. Any suitable purge/carrier gas can be used, such as argon, helium, hydrogen, nitrogen, or mixtures thereof. The overall pre-cleaning gas mixture is from about 0.05% to about 20% by volume of ammonia and nitrogen trifluoride. The remainder of the pre-cleaning gas mixture may be the purge/carrier gas.

The operating pressure within the pre-clean chamber can be varied. The pressure may be maintained between about 1 Torr and about 10 Torr. A RF source power may be applied to maintain a plasma in the cleaning gas mixture. For example, a power of about 15 Watts to about 100 Watts may be applied to maintain a plasma inside the pre-cleaning processing chamber. The frequency at which the power is applied is about 350 kHz. The frequency can range from about 50 kHz to about 350 kHz. The plasma energy dissociates the ammonia and nitrogen trifluoride gases into reactive species, e.g., fluorine radicals and/or hydrogen radicals that combine to form a highly reactive ammonia fluoride ($NH_4F$) compound and/or ammonium hydrogen fluoride ($NH_4F\cdot HF$) in the gas phase. These molecules are then delivered from the plasma location to the substrate surface to be cleaned. A purge/carrier gas can be used to facilitate the delivery of the reactive species to the substrate. In one implementation, a titanium layer may be deposited after the pre-cleaning process. The titanium layer operates to gather any remaining oxygen at the interface of the via and the underlying substrate which provides for improved electrical contact with the underlying substrate.

Figure 4B:
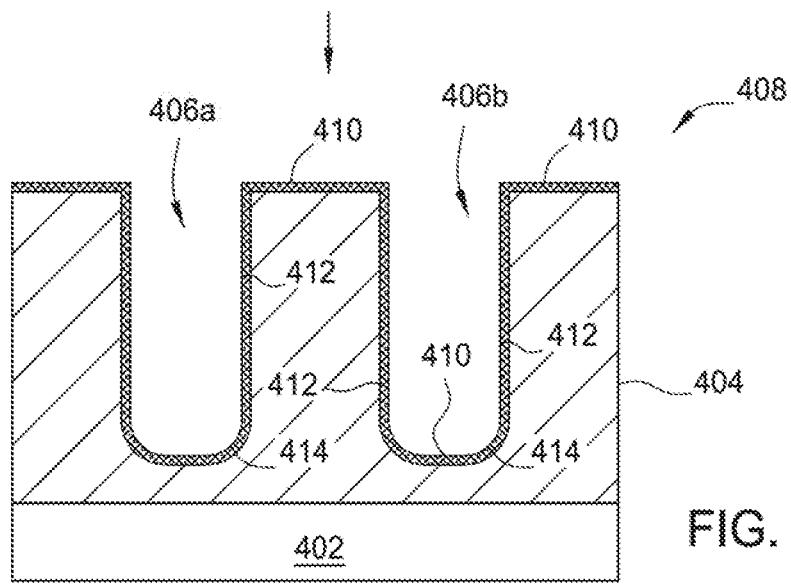

At block 320, prior to deposition of a metal layer on the substrate 402, but after the substrate 402 is provided in the metal deposition processing chamber 150 at block 310, a pretreatment process may be performed to pre-treat the substrate surface 411, thus, forming a treated surface region 410 on the substrate surface 411, sidewalls 412 and bottoms 414 of the feature definitions 406a, 406b in the layer 404, as shown in FIG. 4B. It should be noted that although two feature definitions 406a, 406b are shown, the substrate 402 may have any number of feature definitions 406. In certain implementations, the substrate surface 411 may have some weak or residual dangling bonding structures of Si—F, N—F, H—F, and Si—N on the substrate surface left from the optional pre-cleaning process previously performed on the substrate 402. The dangling bonds may undesirably and adversely obstruct absorption or adherence of metallic atoms deposited on the substrate surface in the subsequent metal deposition process. Thus, the pretreatment process at block 320 may be performed to efficiently alter the surface bonding structure of the substrate surface 411 of the silicon containing layer 404, thereby providing a surface having a good absorption ability to promote adherence of metallic atoms provided from the subsequent metal deposition process. It is believed that the pretreatment process may efficiently convert or remove the bonding structure of Si—F, H—F, N—F, and Si—N, into the bonding of Si—H or Si—Si, which may assist in the adherence of the metallic atoms to form a layer thereon.

In one implementation, a pre-treatment gas mixture may be supplied into the metal deposition processing chamber 150 to alter the surface properties of the substrate 402 prior to the metal deposition process. In one implementation, the pre-treatment gas mixture may include at least a hydrogen containing gas, such as $H_2$, $H_2O$, $H_2O_2$, or the like. An inert gas, such as Ar, He, Kr, and the like, may also be supplied into the pre-treatment gas mixture. Additionally, a nitrogen containing gas, such as $N_2$, $NH_3$, $N_2O$, $NO_2$, and the like, may also be supplied into the pre-treatment gas mixture. In an exemplary implementation, the pre-treatment gas mixture supplied to pre-treat the substrate surface 411 includes a hydrogen containing gas, such as a $H_2$ gas, and an inert gas, such as Ar gas. In another exemplary implementation, the pre-treatment gas mixture supplied to pre-treat the substrate surface 411 includes a hydrogen containing gas, such as a $H_2$ gas, an inert gas, such as Ar gas, and a nitrogen containing gas, such as a $NH_3$ gas.

The pre-treatment gas mixture may be supplied from a remote plasma source, such as the remote plasma source 141 coupled to the metal deposition processing chamber 150, to supply the pre-treatment gas mixture plasma remotely from the processing chamber 150 to the substrate surface 411. Alternatively, the pre-treatment gas mixture may be supplied from any other suitable sources installed in the processing chamber 150 to the substrate surface 411.

During the pretreatment process at block 320, several process parameters may be regulated to control the pretreatment process. In one exemplary implementation, a process pressure in the metal deposition processing chamber 150 is regulated between about 50 mTorr to about 5000 mTorr, such as between about 500 mTorr and about 1000 mTorr, for example, at about 700 mTorr. An RF source power may be applied to maintain a plasma in the pretreatment gas mixture. For example, a power of about 1000 Watts to about 6000 Watts may be applied to maintain a plasma inside the processing chamber 150. The hydrogen containing gas supplied in the pretreatment gas mixture may be flowed into the processing chamber 150 at a rate between about 400 sccm to about 4000 sccm and the inert gas supplied in the pretreatment gas mixture may be flowed at a rate between about 200 sccm and about 2000 sccm. The nitrogen containing gas supplied in the pretreatment gas mixture may be flowed at a rate between about 100 sccm and about 3000 sccm. A temperature of the substrate 402 is maintained between about 125 degrees Celsius to about 250 degrees Celsius. In one implementation, the substrate 402 is subjected to the pretreatment process for between about 10 seconds to about 2 minutes, depending on the operating temperature, pressure, and flow rate of the gas. For example, the substrate 402 can be exposed for about 30 seconds to about 60 seconds. In an exemplary implementation, the substrate is exposed for about 40 seconds or less.

Figure 4C:
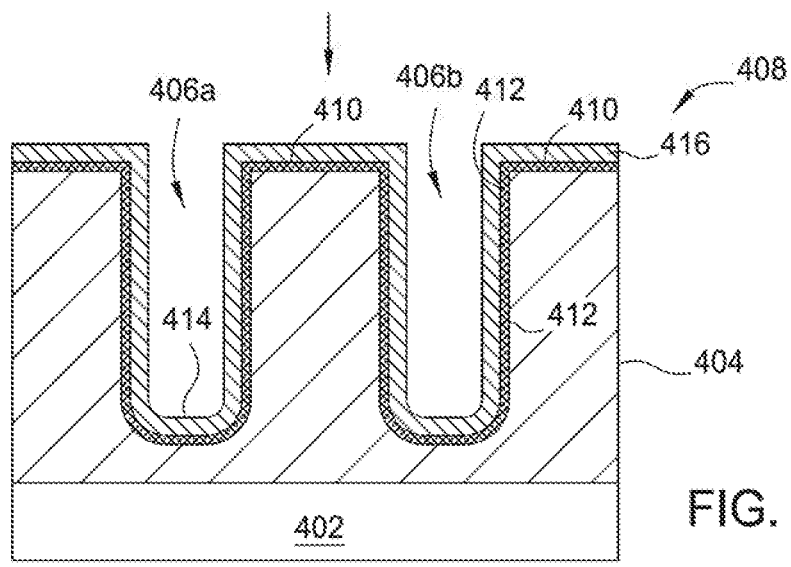

Optionally, at block 330 a barrier layer deposition process may be performed to deposit a barrier layer 416 in the feature definitions 406a, 406b as shown in FIG. 4C. The barrier layer 416 generally prevents diffusion of the metal layer to the junction material on the substrate, typically a silicon or silicon germanium compound. The barrier layer generally contains a metal or a metal nitride material, such as titanium (Ti), titanium nitride (TiN), alloys thereof, or combinations thereof. The barrier layer 416 may also comprise plasma nitrided ($N_2$ or $NH_3$) Ti and PVD Cobalt. If the barrier layer 416 comprises a nitrided Ti layer, only the top few angstroms of titanium are converted to a TiN compound. It has been found that both oxidized and non-oxidized Ti and TiN barrier layers provide for improved diffusion resistance. The barrier layer 416 may have a thickness within a range from about 2 Å to about 100 Å, more narrowly within a range from about 3 Å to about 80 Å, more narrowly within a range from about 4 Å to about 50 Å, more narrowly within a range from about 5 Å to about 25 Å, more narrowly within a range from about 5 Å to about 20 Å, more narrowly within a range from about 5 Å to about 15 Å, and more narrowly within a range from about 5 Å to about 10 Å. The barrier layer is generally deposited by atomic layer deposition (ALD), plasma-enhanced ALD (PE-ALD), chemical vapor deposition (CVD), or physical vapor deposition (PVD) processes.

The barrier layer 416 is similar to a wetting layer, which is described in detail below. The barrier layer 416, as described above, generally prevents diffusion of the metal layer to the junction material on the substrate. A wetting layer generally enhances the adherence of the metal layer, Cobalt in some implementations, which reduces the formation of undesirable voids in the feature definitions during annealing processes performed on the metal layer.

Figure 4D:
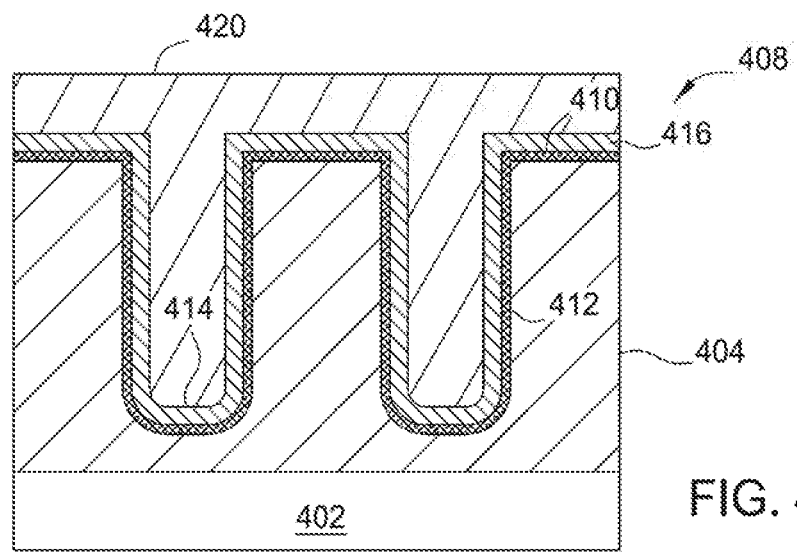
Figure 4E:
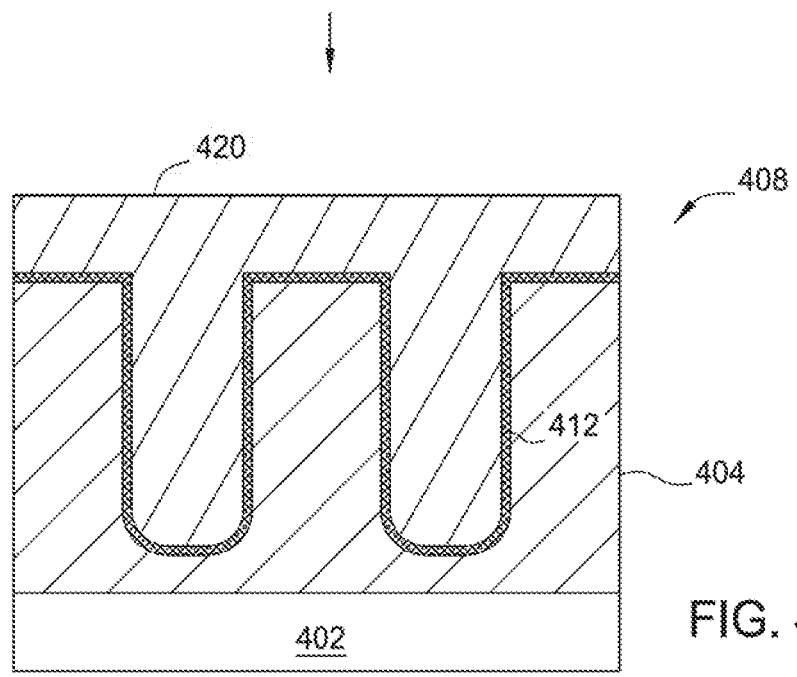

At block 340, after the pre-treatment process of block 320 is performed on the substrate surface to form the treated surface region 410 or deposition of the barrier layer 416 in block 330, a CVD or PVD metal deposition process may be performed in the processing chamber 150 to deposit a metal layer 420, as shown in FIG. 4D. The metal layer 420 may be deposited using the cyclic deposition process described in FIG. 5. The metal layer 420 fills the feature definitions 406a, 406b. Suitable examples of the metal layer 420 include titanium (Ti), cobalt (Co), nickel (Ni), alloys thereof, or any combination thereof. In one particular implementation described therein, the metal layer 420 deposited on the substrate 402 is a cobalt (Co) layer.

The metal layer 420 may be deposited using a multi-step deposition process comprising multiple cycles of performing a cyclic metal deposition process to deposit the metal layer 420 followed by annealing the metal layer 420. In certain implementations, the thickness of the metal layer 420 should be less than 50% of the feature definition diameter (critical dimension) of the smallest feature definition to be filled. For example, the cyclic metal deposition process is performed to partially fill a feature definition to less than half of the feature definition diameter followed by an anneal process. The cyclic deposition process followed by an anneal would then be repeated to deposit until the metal layer 420 achieved a predetermined thickness. In an alternative implementation, the metal layer 420 may be deposited to completely fill the feature definition in a single, non-cyclic deposition process. In this implementation, the metal layer 420 is then annealed. The non-cyclic metal layer deposition process and subsequent anneal processes increase throughput because they require less time to complete.

Figure 5:
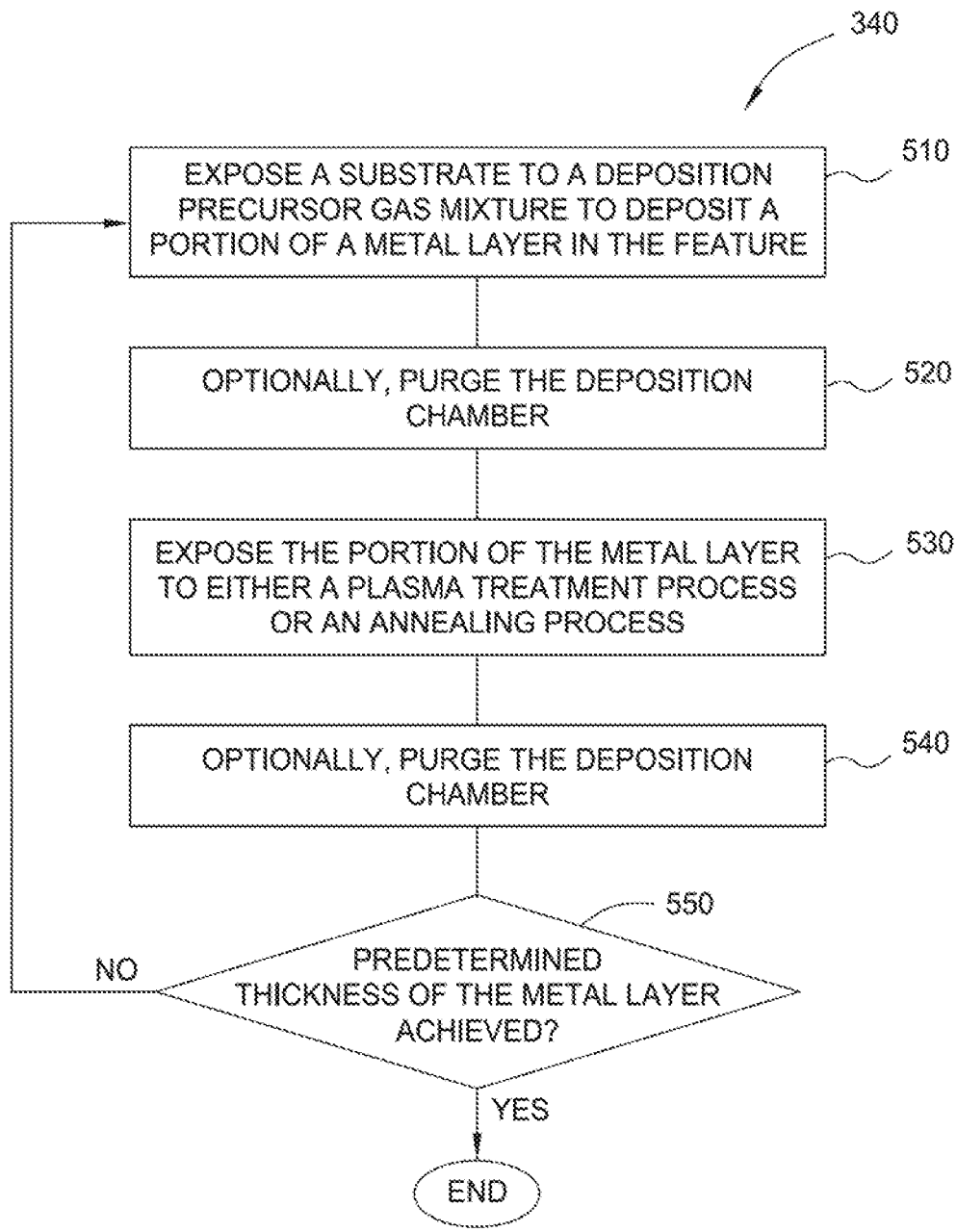
FIG. 5 depicts a flow diagram for a cyclic deposition process for forming a metal layer in a semiconductor device in accordance with certain implementations described herein.

FIG. 5 depicts a flow diagram for a cyclic deposition process as shown in block 340 for forming a metal layer, such as metal layer 420, in a semiconductor device in accordance with one implementation of the present disclosure. In one implementation, the process includes exposing a substrate to a deposition gas to form a portion of a metal layer (block 510), optionally purging the deposition chamber (block 520), exposing the substrate to either a plasma treatment process or an annealing process (block 530), optionally purging the deposition chamber (block 540), and determining if a predetermined thickness of the metal layer has been achieved (block 550). In one implementation, the cycle of blocks 510-550 may be repeated if the cobalt metal layer has not been formed having the predetermined thickness. Alternately, the process may be stopped once the metal layer has been formed having the predetermined thickness.

During the metal deposition process, the metal layer 420 may be formed or deposited by introducing a deposition precursor gas mixture including a cobalt precursor or a nickel precursor simultaneously with, sequentially with, or alternatively without a reducing gas mixture (reagent), such as a hydrogen gas ($H_2$) or a $NH_3$ gas, into the metal deposition processing chamber 150 during a thermal CVD process, a pulsed-CVD process, a PE-CVD process, a pulsed PE-CVD process, or a thermal ALD process. Additionally, the deposition precursor gas mixture may also include a purge gas mixture supplied concurrently into the processing chamber for processing. In another implementation, the metal layer 420 may be formed or deposited by sequentially repetitively introducing a pulse of the deposition precursor gas mixture, such as a cobalt precursor, and a pulse of a reducing gas mixture, such as a hydrogen gas ($H_2$) or a $NH_3$ gas, into the metal deposition processing chamber 150 during a thermal ALD process or a pulsed PE-CVD process. In another implementation, the metal layer 420 may be formed or deposited by continuously flowing the reducing gas mixture, such as a hydrogen gas ($H_2$) or a $NH_3$ gas, while repetitively introducing a pulse of the deposition precursor gas mixture, such as a cobalt precursor, and a pulse of a reducing gas mixture into the metal deposition processing chamber 150 during a thermal ALD process or a pulsed PE-CVD process. In another implementation, the metal layer 420 may be formed or deposited by continuously flowing the reducing gas mixture, such as a hydrogen gas ($H_2$) or a $NH_3$ gas, and the deposition precursor gas mixture, such as a cobalt precursor, under plasma conditions during a PE-CVD process. In another implementation, the metal layer 420 may be formed or deposited by continuously flowing the reducing gas mixture, such as a hydrogen gas ($H_2$) or a $NH_3$ gas under plasma conditions and periodically pulsing the deposition precursor gas mixture, such as a cobalt precursor during a PE-CVD process.

Suitable cobalt precursors for forming cobalt-containing materials (e.g., metallic cobalt or cobalt alloys) by CVD or ALD processes described herein include cobalt carbonyl complexes, cobalt amidinates compounds, cobaltocene compounds, cobalt dienyl complexes, cobalt nitrosyl complexes, derivatives thereof, complexes thereof, plasma thereof, or combinations thereof. In some implementations, cobalt materials may be deposited by CVD and ALD processes further described in commonly assigned U.S. Pat. No. 7,264,846 and U.S. Ser. No. 10/443,648, filed May 22, 2003, and published as US 2005-0220998.

Suitable cobalt precursors may include, but not limited to, cobalt carbonyl complexes, cobalt amidinates compounds, cobaltocene compounds, cobalt dienyl complexes, cobalt nitrosyl complexes, cobalt diazadienyl complexes, cobalt hydride complexes, derivatives thereof, complexes thereof, plasmas thereof, or combinations thereof. In one implementation, examples of the cobalt precursors that may be used herein include dicobalt hexacarbonyl butylacetylene (CCTBA, $(CO)_6Co_2(HC\equiv C^tBu)$), dicobalt hexacarbonyl methylbutylacetylene $((CO)_6Co_2(MeC\equiv C^tBu))$, dicobalt hexacarbonyl phenylacetylene $((CO)_6Co_2(HC\equiv CPh))$, dicobalt hexacarbonyl methylphenylacetylene $((CO)_6Co_2(MeC\equiv CPh))$, dicobalt hexacarbonyl methylacetylene $((CO)_6Co_2(HC\equiv CMe))$, dicobalt hexacarbonyl dimethylacetylene $((CO)_6Co_2(MeC\equiv CMe))$, cobalt amidinate ($C_{20}H_{42}CoN$), cobalt hexafluoroacetylacetone ($Co(C_5HF_6O_2)_2 \cdot xH_2O$), cobalt acetylacetonate $((CH_3COC=COCH_3)_3Co)$, cobalt (II) acetlyacteonate $((CH_3COC=COCH_3)_2Co)$, cobalt acetate $((CH_3COO)_2Co)$, derivatives thereof, complexes thereof, plasmas thereof, or combinations thereof. Other exemplary cobalt carbonyl complexes include cyclopentadienyl cobalt bis(carbonyl) ($CpCo(CO)_2$), tricarbonyl allyl cobalt $((CO)_3Co(CH_2CH=CH_2))$, cobalt tricarbonyl nitrosyl ($Co(CO)_3NO$), derivatives thereof, complexes thereof, plasmas thereof, or combinations thereof. In one particular example of the cobalt precursors used herein is dicobalt hexacarbonyl butylacetylene (CCTBA, $(CO)_6Co_2(HC\equiv C^tBu)$). It is noted that the dicobalt hexacarbonyl butylacetylene (CCTBA, $(CO)_6Co_2(HC\equiv C^tBu)$) precursor may be supplied into the metal deposition processing chamber 150 with a carrier gas, such as an Ar gas.

Examples of the alternative reagents (i.e., reducing agents used with cobalt precursors for forming the cobalt materials during the deposition process as described herein may include hydrogen (e.g., $H_2$ or atomic-H), nitrogen (e.g., $N_2$ or atomic-N), ammonia ($NH_3$), hydrazine ($N_2H_4$), a hydrogen and ammonia mixture ($H_2/NH_3$), borane ($BH_3$), diborane ($B_2H_6$), triethylborane ($Et_3B$), silane ($SiH_4$), disilane ($Si_2H_6$), trisilane ($Si_3H_8$), tetrasilane ($Si_4H_{10}$), methylsilane ($SiCH_6$), dimethylsilane ($SiC_2H_8$), phosphine ($PH_3$), derivatives thereof, plasmas thereof, or combinations thereof. In one particular example, the reagent or reducing agent used herein is ammonia ($NH_3$).

During the cyclic deposition process at block 340, in between each pulse of the deposition precursor gas mixture and the plasma pretreatment process, a purge gas mixture may be supplied from a side/edge and/or a bottom of the processing chamber 150 in between each or selected deposition precursor pulses to the edge portion 151 of the substrate 402. The purge gas mixture may be supplied from the side and/or bottom purge gas source 123 and 125 disposed in the processing chamber 150 to supply the purge gas mixture to an edge/periphery of the substrate 402 surface. It is noted that the edge/periphery region of the substrate 402 as described herein may refer to a substrate 402 edge region between about 1 mm and about 5 mm from the substrate edge/bevel for a 300 mm substrate or between about 145 mm and about 149 mm from the substrate center point/center line (e.g. a diameter passing through the substrate center point). It should also be understood that gas flows during either the plasma treatment process or annealing process of block 530 may also serve to purge the process chamber.

In one implementation, the purge gas mixture supplied in the metal deposition process may include at least a hydrogen containing gas and an inert gas. It is noted that the purge gas mixture may be supplied with the deposition precursor gas mixture during the deposition process as needed. Suitable examples of the hydrogen containing gas may include $H_2$, $H_2O$, $H_2O_2$ or the like. Suitable examples of the inert gas include Ar, He, or Kr. In one particular implementation, the purge gas mixture supplied during the metal deposition process may include $H_2$ and Ar gas.

In one implementation of the deposition process, a pulse of the deposition precursor gas mixture along with a reducing gas and optionally a purge/carrier gas mixture is supplied to the processing chamber 150. The term pulse as used herein refers to a dose of material injected into the process chamber. The pulse of the deposition precursor gas mixture continues for a predetermined time interval. Between each pulse of the deposition precursor gas mixture and the plasma treatment process, the purge gas mixture may be pulsed into the processing chamber in between each or multiple pulses of the deposition precursor gas mixture to remove the impurities or residual precursor gas mixture which is unreacted/non-absorbed by the substrate 402 surface (e.g., unreacted carbon containing impurities from the cobalt precursor or others) so they may be pumped out of the processing chamber.

The time interval for the pulse of the deposition precursor gas mixture is variable depending on a number of factors such as, film thickness requirement, process chamber volume, throughput concern, gas flow rate, and the like. In one implementation, the process conditions are advantageously selected so that a pulse of the deposition precursor gas mixture provides a sufficient amount of precursor, such that at least a monolayer of the cobalt metal precursor is adsorbed on the substrate 402. Thereafter, excess cobalt metal precursor remaining in the chamber may be removed from the processing chamber and pumped out by the purge gas mixture.

In some implementations, the reducing gas mixture may be supplied concurrently with the deposition precursor gas mixture in a single pulse to form the metal layer 420. In one implementation depicted herein, the pulse of the reducing gases may be co-flowed with the deposition precursor gas mixture after a first few pulses, such as between first to fifth pulses, of the deposition precursor gas mixture.

In operation at block 510, a first pulse of the deposition precursor gas mixture is pulsed into the processing chamber 150 to deposit a portion of the metal layer 420 on the substrate. Each pulse of the deposition precursor gas mixture into the processing chamber 150 may deposit a metal layer (e.g., a cobalt layer) having a thickness between about 5 Å and about 100 Å. During pulsing of the deposition precursor gas mixture, several process parameters are also regulated. In one implementation, the process pressure is controlled at between about 7 Torr and about 30 Torr. The processing temperature is between about 125 degrees Celsius and about 250 degrees Celsius. For plasma enhanced processes, the RF power may be controlled at between about 100 Watts and about 1200 Watts. The cobalt gas precursor supplied in the deposition precursor gas mixture may be controlled at between about 1 sccm and about 10 sccm. The reducing gas, such as the $H_2$ gas, may be supplied at between about 100 sccm and about 10,000 sccm, such as between about 3000 sccm to about 5000 sccm. The $H_2$ gas supplied from the substrate edge/substrate bottom may be controlled at between about 200 sccm and about 1000 sccm. Argon gas may be supplied from the substrate edge/substrate bottom at between about 200 sccm and about 1000 sccm.

Optionally, after block 510, the process chamber may be purged. After pulsing of the deposition precursor gas mixture, a purge gas mixture is then supplied into the processing chamber to purge out the residuals and impurities from the processing chamber. During pulsing of the purge gas mixture, the process pressure may be pumped down to a certain low level, such as lower than 2 Torr, for example lower than 0.5 Torr, at a relatively short time interval, such as between about 1 second and about 5 seconds, so as to assist rapidly pumping out the residuals and impurities from the processing chamber. Several process parameters are also regulated during pulsing of the purge gas mixture. In one implementation, the process pressure is controlled at between about 0.1 Torr and about 2 Torr, such as 0.1 Torr and about 1 Torr, for example between about 0.1 Torr and about 0.6 Torr. The processing temperature is between about 125 degrees Celsius and about 250 degrees Celsius. The RF power may be controlled at between about 100 Watts and about 800 Watts. The $H_2$ gas supplied in the purge gas mixture may be controlled at between about 200 sccm and about 1000 sccm. The Ar gas may be supplied at between about 200 sccm and about 1000 sccm.

At block 530, subsequent to either exposing the substrate 402 to a deposition gas at block 510 or purging the deposition chamber at block 520 the substrate 402 is exposed to either a plasma treatment process or an annealing process. The plasma treatment process or annealing process reduces surface roughness and improves the resistivity of the as deposited portion of the metal layer 420.

Exemplary plasma forming gases for the plasma treatment process of block 530 include hydrogen ($H_2$), nitrogen ($N_2$), ammonia ($NH_3$), and combinations thereof. During the plasma treatment process, several process parameters are also regulated. In one implementation, the process pressure is controlled at between about 7 Torr and about 30 Torr. The processing temperature is between about 125 degrees Celsius and about 250 degrees Celsius. The RF power may be controlled at between about 100 Watts and about 800 Watts, for example, about 400 Watts. The plasma forming gas, such as $H_2$ gas, may be supplied at between about 3000 sccm and about 5000 sccm, for example, about 4000 sccm. The $H_2$ gas supplied from the substrate edge/substrate bottom may be controlled at between about 200 sccm and about 1000 sccm. The Ar gas may be supplied from the substrate edge/substrate bottom at between about 200 sccm and about 1000 sccm.

It has been shown that the plasma treatment either during deposition or after deposition helps reduce the surface roughness of the as-deposited film and helps reduce carbon impurities in the as-deposited film. Thus, H radical life time, especially inside the narrow (<15 nm critical dimension and >5 aspect ratio) via and trench structures expected for transistor technology node ≤14 nm, is an important parameter to enable seamless and void-free cobalt gap fill. The lifetime of the H radical inside the chamber during a CVD process can be improved by flowing an inert gas, such as He, Ne, Ar, among others, during the plasma treatment using an inductively coupled plasma source, microwave plasma source, or e-beam plasma source. The plasma sources are available from Applied Materials, Inc. or other vendors.

In some implementations, the annealing process of block 530 is a hydrogen purge process. In some implementations, the annealing process of block 530 may have a temperature range between about 50 degrees Celsius and about 1400 degrees Celsius (e.g., between about 50 degrees Celsius and 500 degrees Celsius; between about 100 degrees Celsius and about 300 degrees Celsius; between about 300 degrees Celsius and 500 degrees Celsius). During the thermal annealing process, a gas mixture including at least a hydrogen containing gas and/or an inert gas (e.g., argon) is supplied into the chamber. The gas mixture may be supplied to the annealing chamber using either a static process where the chamber is filled with gas prior to the anneal process or a continuous flow process where the gas mixture is continuously flowed through the chamber during the anneal process.

In one implementation, where the annealing process at block 530 is a hydrogen purge process, the hydrogen purge process may be performed by supplying a gas mixture including at least one of a hydrogen containing gas, an inert gas, and a nitrogen containing as into the annealing chamber at a flow rate between about 1,000 sccm and about 30,000 sccm, for example, between about 5,000 sccm and 15,000 sccm, controlling a chamber pressure of about 5 Torr to about 1,000 Torr (e.g., between about 5 Torr and about 60 Torr; between about 20 Torr and about 40 Torr), maintaining a temperature range between about 50 degrees Celsius and about 500 degrees Celsius (e.g., between about 100 degrees Celsius and about 300 degrees Celsius; between about 300 degrees Celsius and 500 degrees Celsius), for example, between about 100 degrees Celsius and about 300 degrees Celsius. The thermal annealing process of block 530 may be performed, optionally while rotating the substrate, for between about 30 seconds and about 600 seconds. Suitable examples of gases for the gas mixture supplied in the chamber may include at least one of a hydrogen gas, a nitrogen containing gas, an inert gas (e.g., argon) or other gases as needed. In some implementations, where the annealing process of block 530 includes the hydrogen purge process, the temperature for the process of block 530 may be the same as or similar to the temperature used to deposit the metal layer in block 510.

In some implementations, the thermal annealing process may be performed in-situ in the same processing chamber as the cyclic metal deposition process. In some implementations where both the metal layer deposition and anneal may be performed in the same chamber if the chamber has the capability to heat the substrate to temperatures required for processing. In some implementations, the thermal annealing process may be performed in a separate processing chamber.

It has been shown that carbon impurities can be reduced by the hydrogen purge/anneal as demonstrated by resistivity reduction.

Subsequent to exposing the substrate to either a plasma treatment process or an annealing process in block 530, the deposition chamber may optionally be purged in block 540. The optional purge of block 540 may be performed similarly to the purge process described in block 520.

At block 550, if the predetermined thickness of the metal layer 420 has not been achieved, additional cycles starting from exposing the substrate to the deposition precursor gas mixture followed with the plasma pretreatment process can then be repeatedly performed until a desired thickness range of the metal layer 420 is reached. If the predetermined thickness of the metal layer has been achieved, the process proceeds to block 350 where a thermal annealing process is performed.

For example, if the total thickness of the metal layer is 10 nm and the portion of the metal layer is deposited at 2 nm/cycle then 5 cycles of (2 nm deposition followed by plasma treatment) will be needed.

At block 350, a thermal annealing process is performed in a chamber on the substrate 402 to improve the properties of the metal layer 420. In some implementations, the thermal annealing process may be performed in-situ in the same processing chamber as the cyclic metal deposition process. In some implementations, the thermal annealing process may be performed in a separate processing chamber. The thermal annealing chamber may be one of the processing chambers 212, 214, 216, 232, 234, 236, 238 of the system 200 as needed. In one implementation, the thermal annealing process performed at block 350 may have a temperature range between about 200 degrees Celsius and about 1400 degrees Celsius (e.g., between about 200 degrees Celsius and about 500 degrees Celsius; between about 300 degrees Celsius and about 500 degrees Celsius). During the thermal annealing process, a gas mixture including at least a hydrogen containing gas and/or an inert gas (e.g., argon) is supplied into the annealing chamber. The gas mixture may be supplied to the annealing chamber using either a static process where the chamber is filled with gas prior to the anneal process or a continuous flow process where the gas mixture is continuously flowed through the annealing chamber during the anneal process.

In one implementation, the thermal annealing process at 350 may be performed by supplying a gas mixture including at least one of a hydrogen containing gas, an inert gas, and a nitrogen containing as into the annealing chamber at a flow rate between about 100 sccm and about 2000 sccm, controlling a chamber pressure of about 0.5 Torr and about 15 Torr, for example, between about 5 Torr and about 8 Torr, maintaining a temperature range between about 150 degrees Celsius and about 500 degrees Celsius, for example, between about 300 degrees Celsius and about 475 degrees Celsius, and performing the thermal annealing process, optionally while rotating the substrate, for between about 30 seconds and about 600 seconds. Suitable examples of gases for the gas mixture supplied in the thermal annealing chamber may include a hydrogen gas, a nitrogen containing gas, an inert gas (e.g., argon) or other gases as needed. In one implementation, the gas mixture supplied into the processing chamber to perform the silicidation process includes hydrogen gas ($H_2$) supplied at a flow ratio between about 1:10 and about 1:1, such as about 1:3.

An example of a suitable thermal processing chamber, in which block 350 may be performed, is a dual mode degas (DMD) chamber, available from Applied Materials, Inc. Other examples of suitable thermal processing chambers are the Vantage® Vulcan™ RTP chamber and the Vantage® Astra™ DSA chamber or batch furnace tool. It should be noted that the annealing process may not necessarily be integrated with the metal layer 420 deposition chamber. The use of RTP and DSA anneal may provide for further control of temperature uniformity and rapid temperature change. It is noted that other thermal annealing chamber available from other manufactures may also be utilized to practice the present disclosure.

After the thermal annealing process is completed, at block 360, if the predetermined thickness of the metal layer 420 has not been achieved, additional cycles starting from performing a cyclic metal deposition to deposit a metal layer at block 340 followed by performing an annealing process on the metal layer at block 350 can then be repeatedly performed until a desired thickness range of the metal layer 420 is reached. If the predetermined thickness of the metal layer has been achieved, the process is complete and additional processing steps may be performed.

Thus, according to the aforementioned implementations, methods for depositing a metal layer in a feature definition are provided. The methods include filling feature definitions with seamless metal layers by annealing the as-deposited metal layers. Annealing of CVD cobalt films results in a bottom-up, seamless gap fill. In certain implementations, a wetting layer is not required for reflow of cobalt. Thickness of the metal layer (e.g., CVD cobalt layer) may be less than 50% of the feature definition diameter (critical dimension). A cyclic process utilizing a combination of thin cobalt film deposition and short-time anneal is used. Ambience during the short-time anneal lowers the required anneal temperature to achieve seamless cobalt fill. A blanket wafer study demonstrates 50% reduction in resistivity of cobalt films after the anneal treatment. Variations of anneal time, temperature, atmosphere (type of gas used), static gas pressure or gas flow during the anneal step may be used to reduce roughness and improve the resistivity of the metal layer. Short anneal time (e.g., 1 minute) is sufficient to reduce cobalt resistivity and roughness. Gas flow during anneal further improves the resistivity of cobalt films. Argon and hydrogen gas or a combination of both may be used for anneal atmosphere. PVD cobalt can be utilized in place of CVD cobalt. A combination of CVD and PVD can also be utilized where CVD cobalt acts as a wetting layer for PVD cobalt re-flow.

Figure 6:
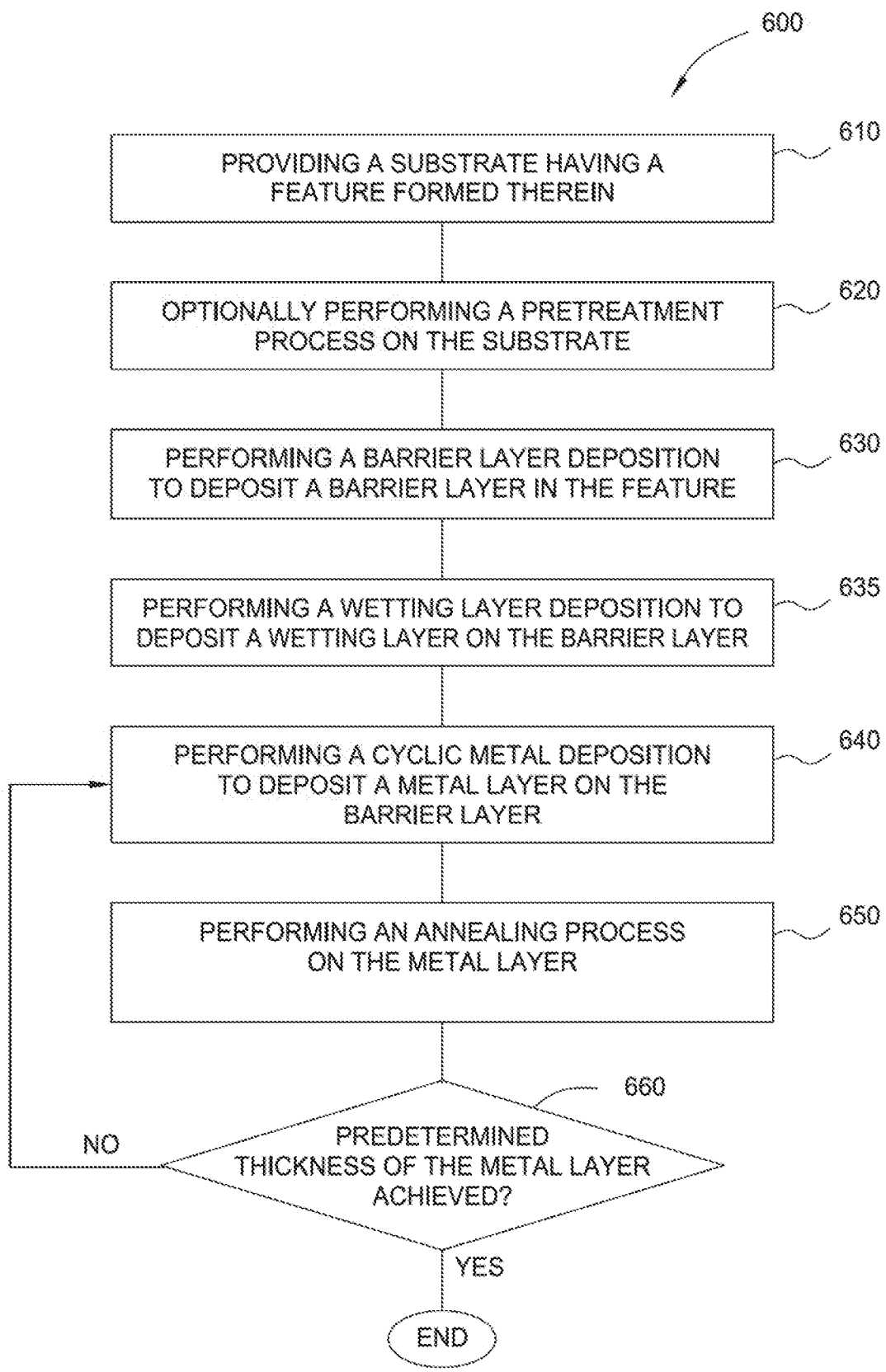
FIG. 6 depicts a flow diagram for forming a metal layer in a semiconductor device in accordance with certain implementations described herein.

FIG. 6 depicts a flow diagram for forming a metal layer in a feature definition of a semiconductor device in accordance with one implementation of the present disclosure. The sequence described in FIG. 6 corresponds to the fabrication stages depicted in FIGS. 7A-7E, which are discussed below. FIGS. 7A-7E illustrate schematic cross-sectional views of a substrate 402 having a device structure 408 formed thereon during different stages of fabricating a metal layer 420 within feature definitions 406a, 406b of the device structure 408 illustrated by the processing sequence 600. The sequence of FIG. 6 is generally provided with reference to a CVD, ALD, or PVD deposited cobalt metal layer.

Certain aspects of the processing sequence 600 are similar to processing sequence 300 described with reference to FIG. 3 and will not be repeated hereinafter for the sake of brevity. In one implementation, blocks 610 and 620 are similar to blocks 310 and 320 depicted in FIG. 3 as described above. Blocks 610 and 620 correspond to the fabrication stages depicted in FIGS. 7A and 7B, respectively. A detailed discussion of FIGS. 7A and 7B may be found with reference to FIGS. 4A and 4B. However, performing a pretreatment process on the substrate may be optional in block 620.

Figure 7A:
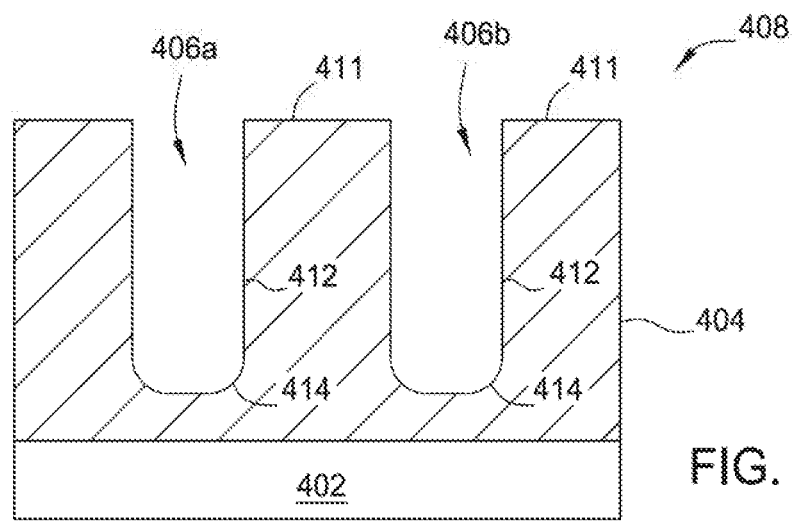
FIGS. 7A-7E depict cross-sectional views of a semiconductor device during the formation of a metal layer manufacture process in accordance with certain implementations described herein.
Figure 7B:
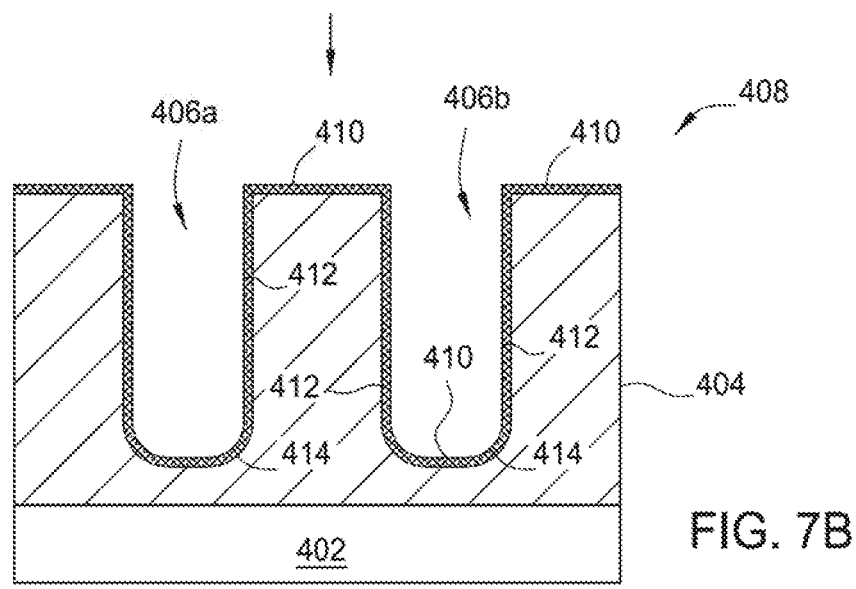
Figure 7C:
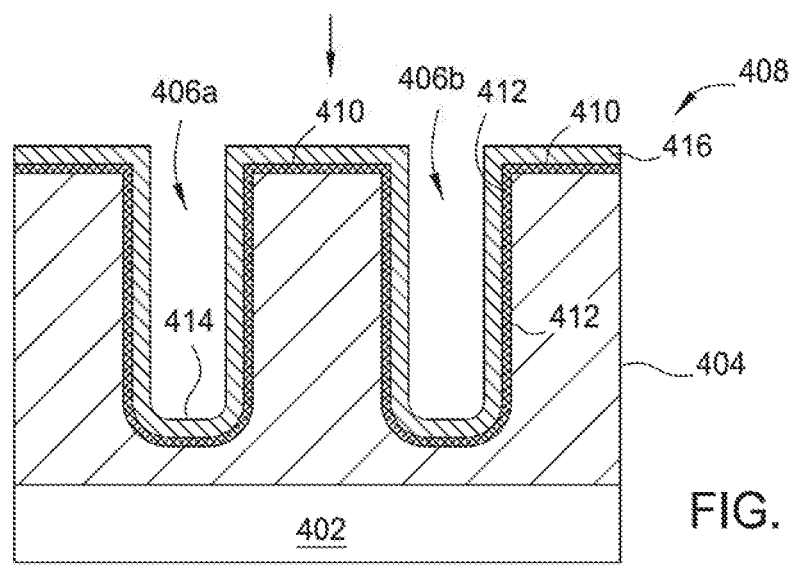

Block 630 provides for performing a barrier layer deposition to deposit a barrier layer 416 on the substrate 402, as shown in FIG. 7C. The barrier layer generally contains a metal or a metal nitride material, such as titanium (Ti), titanium nitride (TiN), alloys thereof, or combinations thereof. The barrier layer 416 may also comprise plasma nitrided ($N_2$ or $NH_3$) Ti and PVD Cobalt. If the barrier layer 416 comprises a nitrided Ti layer, only the top few angstroms of titanium are converted to a TiN compound. It has been found that non-oxidized Ti and TiN barrier layers provide for improved diffusion resistance. The barrier layer 416 may have a thickness within a range from about 2 Å to about 100 Å, more narrowly within a range from about 3 Å to about 80 Å, more narrowly within a range from about 4 Å to about 50 Å, more narrowly within a range from about 5 Å to about 25 Å, more narrowly within a range from about 5 Å to about 20 Å, more narrowly within a range from about 5 Å to about 15 Å, and more narrowly within a range from about 5 Å to about 10 Å. The barrier layer is generally deposited by atomic layer deposition (ALD), plasma-enhanced ALD (PE-ALD), chemical vapor deposition (CVD), or physical vapor deposition (PVD) processes.

In one implementation, performing a barrier layer deposition comprises an ALD process comprising providing a Ti containing precursor, which may be provided to the chamber in the presence of a carrier gas, such as an inert gas. In another implementation, a Ti containing precursor may be provided with a nitrogen containing precursor to form a barrier layer comprising TiN. The Ti containing precursor and the nitrogen containing precursor may be provided in the presence of a carrier gas, such as an inert gas. In another implementation, a nitridation process may be performed on a deposited Ti layer to form a TiN barrier layer. In another implementation, the Ti barrier layer is deposited by a PVD Ti process.

Figure 7D:
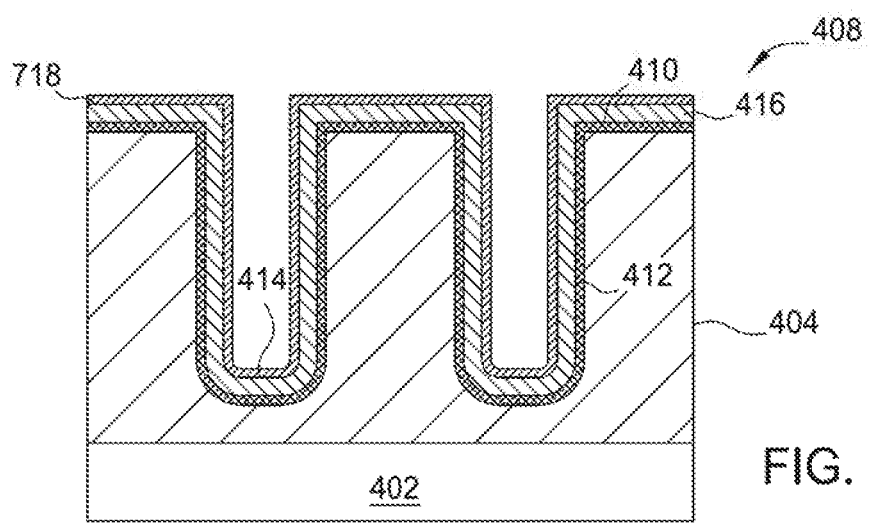
Figure 7E:
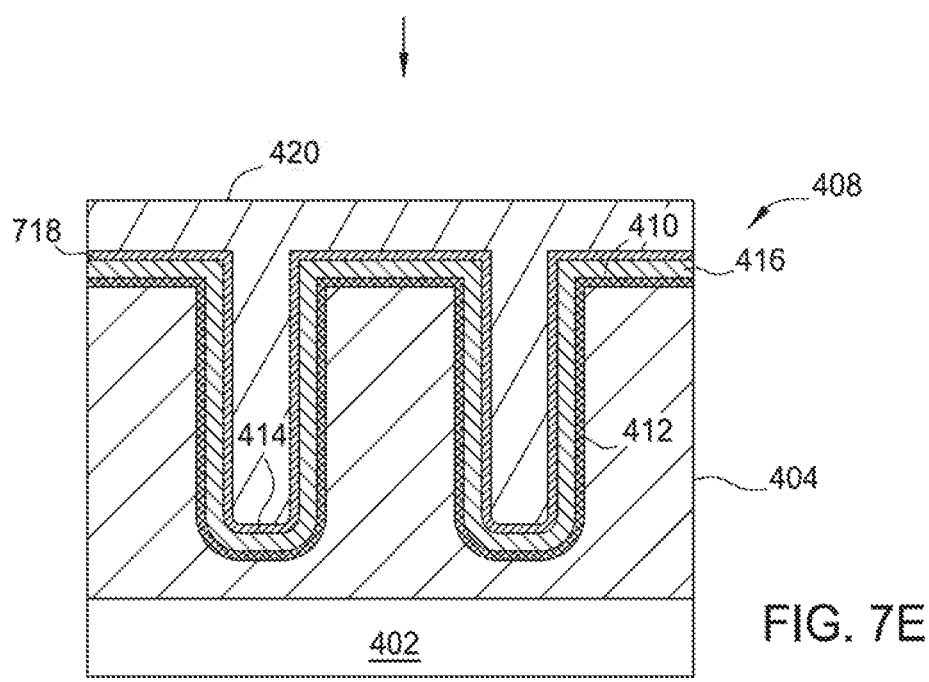

Block 635 provides for performing a wetting layer deposition to deposit a wetting layer 718 on the substrate 402, as shown in FIG. 7D. The wetting layer 718 is deposited over the barrier layer 416. The wetting layer is generally deposited by a process selected from PVD Co, CVD TiN, PVD TiN, CVD Ru, PVD Ru, nitridation of PVD Ti, or combinations thereof. In implementations using a CVD process to deposit the wetting layer 718, a desired precursor gas is provided to the chamber and may be further provided in the presence of a carrier gas. In implementations using a PVD process to deposit the wetting layer 718, a target comprising the desirable material to be deposited is provided and a PVD process is performed to deposit a PVD wetting layer. In one implementation, the wetting layer comprises PVD TiN. In this implementation, a Ti target is provided and bombarded with ions to sputter Ti to deposit the wetting layer 718 over the barrier layer 416. A nitridation process using a nitrogen containing precursor, such as $NH_3$, in the presence of a plasma is performed on the PVD Ti layer to form the TiN wetting layer 718. In this implementation, the wetting layer 718 comprises a nitrided Ti layer and only the top few angstroms of titanium are converted to a TiN compound. In another implementation, the wetting layer is PVD Co. In this implementation, a Co target is provided and bombarded with ions to sputter cobalt to deposit the wetting layer 718 over the barrier layer 416. In the implementation using PVD Co, RF power is provided at a frequency from about 5000 W to about 6000 W, such as about 5500 W. A power of the PVD Co process is provided from about 400 W to about 600 W, such as about 500 W and the pressure of the chamber while performing the PVD Co process is from about 50 mT to about 150 mT, such as about 100 mT.

It should be known that a wetting layer of Ti or TiN may be deposited in the same chamber (under high vacuum) as a subsequent CVD Co deposition process. In an alternate implementation, agglomeration of CVD Co films during anneal involved using CVD Co (with different film properties) as a wetting layer. This CVD Co wetting layer included high carbon atomic %>5% carbon compared to <1% carbon for CVD Co films used for gap-fill purpose. The high carbon content CVD Co films were obtained using lower $H_2$ partial pressure during deposition step and by eliminating cyclic $H_2$ plasma treatment.

It should be noted that any of the aforementioned wetting layer 718 processes may be performed with the subsequent metal layer deposition process, which is provided at block

640. The wetting layer 718 and the barrier layer 416 generally enhance the subsequent metal layer deposition. It has been found that voids may form at the bottom of a feature definition on the substrate or at other locations in the feature definition. The voids are believed to be formed as a result of agglomeration, or the accumulation of the metal layer, when the metal layer is annealed. The voids are generally undesirable because a void between the substrate and the metal layer ultimately reduces the quality of the metal layer and negatively affects overall device performance. Further, inter-diffusion between the metal layer and the underlying substrate during anneal processes result in Co and silicon inter-diffusion. The inter-diffusion negatively affects device performance and leads to unpredictable device behavior. The barrier layer 416, either alone or in combination with the wetting layer 718, reduces the Co and silicon inter-diffusion. Further, the wetting layer, either alone or in combination with the barrier layer 416, enhances the adhesion of the metal layer when it is deposited to fill the vias and trenches of the device by reducing the probability of agglomeration during subsequent anneal processes.

In an alternate implementation, agglomeration of CVD Co films during an anneal process may use CVD Co as a wetting layer. This CVD Co wetting layer may include a high carbon content (atomic %>5%) as compared to a low carbon content (atomic %<1%) carbon for CVD Co films used for seamless gap-fill. The high carbon content CVD Co films were obtained using lower $H_2$ partial pressure during the deposition step and by eliminating cyclic $H_2$ plasma treatment.

Block 640 provides performing a cyclic metal deposition to deposit a metal layer on the substrate. The process parameters and description of the cyclic metal deposition process may be found above with regard to block 340 in FIG. 3 and the corresponding description related to FIG. 5. Block 650 provides for performing an annealing process on the metal layer disposed on the substrate. The process parameters and description of the performing an annealing process may be had with reference to block 350 in FIG. 3.

After the thermal annealing process is completed, at block 660, if the predetermined thickness of the metal layer 420 has not been achieved, additional cycles starting from performing a cyclic metal deposition to deposit a metal layer at block 640 followed by performing an annealing process on the metal layer at block 650 can then be repeatedly performed until a desired thickness range of the metal layer 420 is reached. If the predetermined thickness of the metal layer has been achieved, the process is complete and additional processing steps may be performed.

As noted above, the processing sequence 600 described in FIG. 6, may be had with reference to CVD, ALD, or PVD metal deposition processes. An integrated (non-oxidized) CVD or ALD TiN barrier layer reduced the presence of voids at the bottom of the device feature definition. A vacuum break may be introduced after the wetting layer 718 deposition or after the metal layer 420 deposition before performing the anneal process of block 650. It should be noted that the anneal process of block 650 may be performed in a chamber other than the chamber in which the metal layer 420 was deposited. Moreover, it was found that a high frequency of $H_2$ plasma treatment (plasma treatment at a CVD Co thickness of 20 Å or less), as provided at block 640 (See FIG. 5 for related plasma processing parameters), played a significant role in eliminating void formation at the bottom of the device feature definitions. Finally, it has been found that the reflow characteristics of CVD or ALD metal layers may be regulated by controlling the atomic percent of impurities (i.e. carbon, oxygen, nitrogen, etc.) by the aforementioned process variables provided in the processing sequence 600. A one percent or lower carbon impurity level may be preferable for enabling a seamless metal layer gap-fill, more specifically, a seamless cobalt gap-fill. In addition to the process variables of the metal layer deposition, the impurity levels may be further controlled by the barrier layer 416 and the wetting layer 718.

Figure 8:
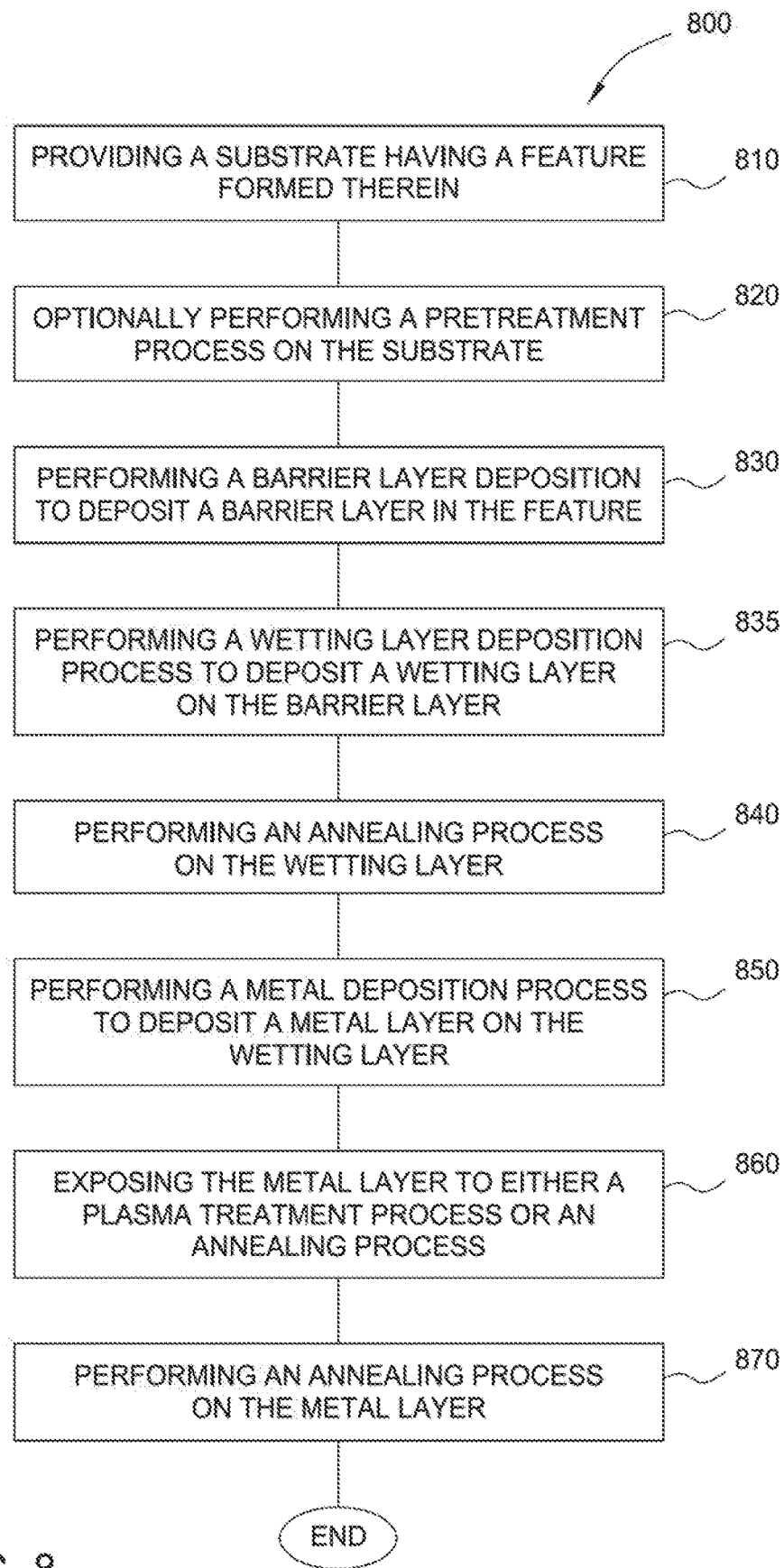
FIG. 8 depicts a flow diagram for forming a metal layer in a semiconductor device in accordance with certain implementations described herein.

FIG. 8 depicts a flow diagram for forming a metal layer in a feature definition of a semiconductor device in accordance with one implementation of the present disclosure. The sequence described in FIG. 8 corresponds to the fabrication stages depicted in FIGS. 7A-7E, which are discussed below. FIGS. 7A-7E illustrate schematic cross-sectional views of a substrate 402 having a device structure 408 formed thereon during different stages of fabricating a metal layer 420 within feature definitions 406a, 406b of the device structure 408 illustrated by the processing sequence 800. The sequence of FIG. 8 is generally provided with reference to a PVD deposited cobalt metal layer.

Processing sequence 800 begins by providing a substrate at block 810. A detailed description of block 810 may be had by reference to the descriptions related to blocks 310 in FIG. 3 and block 610 in FIG. 6. Block 820 provides for optionally performing a pretreatment process on the substrate. A detailed description related to block 820 may be had by reference to the descriptions related to block 320 in FIG. 3 and block 620 in FIG. 6.

Block 830 provides performing a barrier layer deposition to deposit a barrier layer in the feature definition. A general description regarding the barrier layer 416 may be had with reference to block 630 in FIG. 6. In one implementation, the barrier layer 416, such as a TiN barrier layer, is disposed on the substrate. In this implementation, the TiN layer is provided at a thickness of between about 5 Å and about 75 Å, such as about 50 Å. However, it has been shown that a 10 Å TiN layer may be sufficient as a barrier layer. The TiN barrier layer is formed by $NH_3$ or $N_2$ nitridation of a previously deposited Ti layer or by a CVD deposition process. Processing parameters for the deposition of the TiN barrier layer may be found with regard to block 630 in FIG. 6.

Block 835 provides performing a wetting layer deposition to deposit a wetting layer on the barrier layer. A general description of the wetting layer 718 may be had with reference to block 635 in FIG. 6. In one implementation, the wetting layer 718 is deposited by a CVD or ALD process. Suitable processes for providing the wetting layer 718 include CVD TiN, CVD Co, CVD Ru, ALD TaN, and combinations thereof. In one implementation, the wetting layer may be deposited by a CVD Co process. The cobalt deposited during the CVD process is provided to the processing chamber by a cobalt containing precursor, such as the cobalt containing precursors discussed with reference to the cyclic metal deposition process provided in FIG. 3. In one implementation, the cobalt containing precursor is provided to the chamber in a thermal deposition process. The thermal deposition process generally comprises heating the substrate 402 to promote deposition of the cobalt on the surface of the substrate 402. In one implementation, the thermal deposition process provides for heating the substrate from about 100° C. to about 200° C., such as about 150° C. In this implementation, the cobalt deposited during the CVD Co process is the wetting layer 718, which is disposed over the barrier layer 416.

Block 840 provides for performing an annealing process on the wetting layer 718. The annealing process is generally performed to reduce the surface roughness of the wetting layer 718, increase grain size of the crystalline structure, and reduce impurities, such as carbon, that may be present in the wetting layer 718. The annealing process is performed at a temperature of between about 200° C. to about 500° C., such as about 400° C. The annealing process may be performed in a chamber environment where an inert gas, such as argon, is provided in the chamber. In one implementation, argon gas is static within the chamber and the chamber may be optionally purged after the annealing of the wetting layer 718 is performed. In one implementation, the annealing process is performed for a duration of between about 10 seconds to about 1000 seconds, such as between about 30 seconds and about 90 seconds, such as about 60 seconds. In another implementation, the annealing process may be performed in a chamber environment where $H_2$ gas is provided to the chamber in a static or flowing manner. In this implementation, the annealing process may be performed for a duration of between about 10 seconds to about 1000 seconds. In other implementations, the annealing process may be performed with the argon gas and $H_2$ gas.

Block 850 provides for performing a metal deposition process for depositing a metal layer 420 on a substrate. In one implementation, the metal layer 420 is deposited by a PVD Co process. The PVD Co process may further be a thermal PVD Co process. The cobalt is sputtered using conventional processes, and in one implementation, the sputtering process is performed in the presence of a process gas, such as argon or $H_2$. In one implementation, the PVD Co process may be performed by providing RF power at a frequency from about 5000 W to about 6000 W, such as about 5500 W. The RF may be provided in a direct current at a power of between about 250 W and about 750 W, such as about 500 W. The pressure of the chamber during the PVD Co process may be maintained at a pressure of between about 50 mTorr and about 200 mTorr, such as about 100 mTorr. Once the cobalt has been sputtered to the substrate, the cobalt may be reflowed by providing heat to the substrate to reflow the as deposited cobalt. In one implementation, the PVD Co reflow may be performed by heating the substrate to a temperature of between about 200° C. to about 500° C. In implementations where a PVD Co process is employed, both the metal layer 420 deposition and anneal may be performed in the same chamber if the chamber has the capability to heat the substrate to temperatures required for processing.

Block 860 provides for exposing the metal layer 420 to either a plasma treatment process or an annealing process. The plasma treatment process generally comprises providing a process gas, such as $H_2$, to the chamber and applying an RF current to form the process gas into a plasma. In one implementation, the frequency of the RF current is provided between about 200 W and about 800 W, such as about 400 W. The plasma treatment process is performed for about 1 second to about 60 seconds, such as about 30 seconds. In one implementation, the substrate 402 may be heated to a temperature of between about 100° C. to about 200° C., such as about 150° C. to further reduce the surface roughness of the metal layer 420 and reduce the percentage of impurities that may be present in the metal layer 420.

The annealing process of block 860 may be the same as or similar to the hydrogen purge annealing process described in block 530.

Block 870 provides for performing an annealing process on the metal layer 420 disposed in the feature definitions 406a, 406b. The annealing process is generally performed to reduce the surface roughness of the metal layer 420 and reduce impurities, such as carbon, that may be present in the metal layer 420. Further, the annealing process increases crystalline grain size, which results in lower resistivity, resulting in improved integrated circuit performance. The annealing process is performed at a temperature of between about 200° C. to about 500° C., such as about 400° C. The annealing process is further performed in a chamber environment where an inert gas, such as argon, and a process gas, such as $H_2$, are provided in the chamber. In one implementation, argon and $H_2$ gas are flowing within the chamber and the chamber may be optionally purged after the annealing of the metal layer 420 is performed. In one implementation, the annealing process is performed between about 30 seconds and about 90 seconds, such as about 60 seconds.

In the implementations above, the PVD Co process may be performed without a cyclic metal deposition process if the Co deposition and anneal process are performed in a chamber that provides for heating the substrate. In an alternative implementation, a PVD Co layer may be deposited at the bottom of a feature definition and may be etched and re-sputtered on the feature definition sidewall to provide a continuous cobalt film on the sidewall, which allows for reflow of the PVD Co from the field to the bottom of the feature definition. The metal layer 420 deposition is performed to obtain a sufficient film thickness required for a subsequent chemical mechanical polish of the metal layer 420.

In another implementation, the wetting layer 718 comprises CVD Co and the metal layer 420 comprises tungsten (W). This implementation is generally used with a dual damascene type structure having a lower part of the feature definition exhibiting a small critical dimension and aggressive aspect ratio. The upper portion of the dual damascene type structure generally has a greater critical dimension and less aggressive aspect ratio when compared to the lower portion. In this implementation, the lower portion, which presents additional metal layer deposition challenges, may be filled with a CVD Co process as described above. The CVD Co process fills the lower portion of the feature definition. Following the CVD Co deposition, a CVD W process may be performed to fill the remaining portion of the feature definition. The CVD W process generally deposits material at a faster rate than the CVD Co process, thus allowing for increased throughput.

Figure 9:
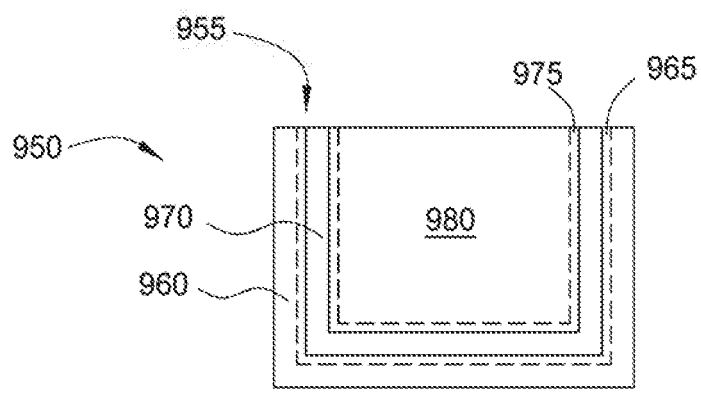
FIG. 9 depicts a cross-sectional view of a substrate containing metal layers used as a conformal gate electrode and deposited according to certain implementations described herein.

FIG. 9 depicts a cross-sectional view of a substrate containing metal layers used as a conformal gate electrode 950 and deposited according to certain implementations described herein, which may be used in a Logic application. Additionally, the semi-conductor structure of FIG. 9 may be used in planar and three dimensional transistors having gate structures. Examples of three dimensional transistors having gate structures include a FinFET (a nonplanar, double-gate transistor built on silicon on insulator technology substrate, based on the earlier DELTA (single-gate) transistor design) or a Trigate transistor structure.

In one implementation, the metal layer described herein may be used in a metal gate structure. For example, FIG. 9 depicts a semiconductor structure, which may be used in a Logic application, having a metal-containing gate electrode 950 containing a metal layer deposited by methods described herein. An initial feature definition 955 is formed in a high-k dielectric material 960 that was previously deposited on the substrate.

A work function material layer 970 is then conformally deposited in the feature definition formed in the high-k dielectric material 960. The metal gate fill material 980 is then formed on the work function material layer 970 and fills the feature definition 955.

A metal gate fill material is used to complete the gate electrode 950 as shown in FIG. 9. The work function material layer 970 and the metal gate fill material 980 may be the same or different material depending on the respective conductivity desired for the gate electrode 950. If a metal gate fill material is used that is different than the work function material, the metal gate fill material may include an electrically conductive material, such as a metal or a metal alloy. Examples of a metal or a metal alloy for use as a metal gate fill material include materials from the group of tungsten, aluminum, copper, cobalt, and combinations thereof, and alloys of tungsten, aluminum, copper, cobalt and combinations thereof.

If the metal gate fill material is used that is the same or substantially the same as the work function material, the metal gate fill material 980 may comprise the metal layers described herein and be deposited by the processes described herein. Alternatively, the work function material layer 970 and the metal gate fill material 980 may be different materials that are both selected from the metal layers described herein, metal carbide, metal carbide silicide, or metal carbide nitride materials. For example, the high-k dielectric constant material may be hafnium oxide, the work function material layer 970 may be hafnium carbide, and the gate fill material may be tantalum carbide. The gate fill material should have an equal or lesser resistivity than the work function material layer.

Optionally, a wetting layer may be deposited prior to the deposition of the metal gate fill material 980. The wetting layer may be a metal material selected from the group of cobalt, tantalum, titanium, and combinations thereof. Alternatively, a barrier layer, which may also be used in conjunction as a wetting layer or perform as a wetting layer, may be deposited before or after the work function material layer. The barrier layer may comprise any suitable barrier layer for the fill material, i.e., tungsten, copper, and aluminum, and may be a metal-containing material selected from the group of tantalum nitride, titanium nitride, tungsten nitride, and combinations thereof. A barrier layer deposited before the work function material layer 970 is shown in layer 965 by broken lines. A barrier layer and/or a wetting layer deposited after the work function material layer 970 but before the metal gate fill material 980 is shown in layer 975 by broken lines. Each of the barrier and/or wetting layers may be deposited to a thickness of 50 Å or less, such as from about 1 Å to about 20 Å.

Figure 10:
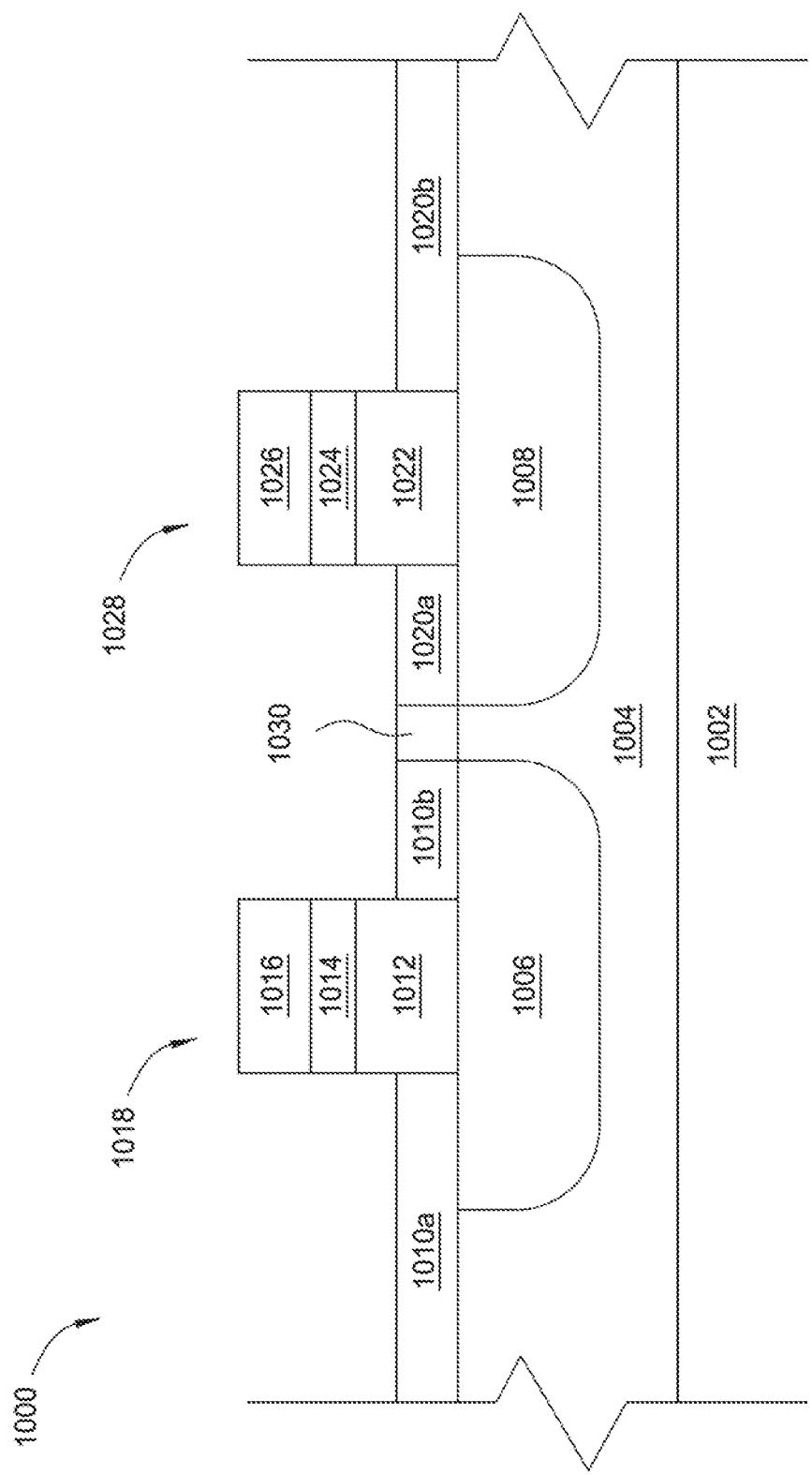
FIG. 10 depicts a cross-sectional view of a CMOS structure having NMOS and PMOS aspects formed according to certain implementations described herein.

FIG. 10 depicts a cross-sectional view of a CMOS structure 1000 having NMOS and PMOS aspects formed according to certain implementations described herein. The CMOS structure 1000 may comprise a substrate 1002 having an epitaxial layer 1004 deposited thereover. Within the epitaxial layer 1004, a p-well 1006 and an n-well 1008 may be formed. Over the p-well 1006, an NMOS structure 1018 may be formed. The NMOS structure 1018 may comprise a source electrode 1010a, a drain electrode 1010b, a high-k dielectric layer 1012, a capping layer 1014, and a gate electrode 1016. Similarly, a PMOS structure 1028 may be formed over the n-well 1008. The PMOS structure 1028 may comprise a source electrode 1020a, a drain electrode 1020b, a high-k dielectric layer 1022, a capping layer 1024 and a gate electrode 1026. The NMOS structure 1018 may be isolated from the PMOS structure 1028 by an isolation region 1030.

The capping layers 1014, 1024 may be present between the high-k dielectric layers 1012, 1022 and the gate electrodes 1016, 1026 to prevent the gate electrodes 1016, 1026 from reacting with the high-k dielectric layers 1012, 1022. The capping layers 1014, 1024 may tune the threshold voltage. In one implementation, the capping layer 1014 in the NMOS structure 1018 is different than the capping layer 1024 of the PMOS structure 1028. For the NMOS structure 1018, the high-k dielectric layer 1012 may be hafnium oxide, and the gate electrode 1016 may comprise a metal deposited according to the implementations described herein.

While the foregoing is directed to implementations of the present disclosure, other and further implementations of the disclosure may be devised without departing from the basic scope thereof, and the scope thereof is determined by the claims that follow.

The invention claimed is:

1. A method for depositing a cobalt metal layer for forming a semiconductor device, comprising:
performing a barrier layer deposition process to deposit a barrier layer in a feature definition formed in a substrate, wherein the barrier layer deposition process comprises depositing a titanium barrier layer, a titanium nitride barrier layer, or a titanium barrier layer followed by a titanium nitride barrier layer;
performing a wetting layer deposition process to deposit a wetting layer on the barrier layer, wherein the wetting layer deposition process comprises depositing a first cobalt layer via a physical vapor deposition process;
performing a cyclic metal deposition process to deposit a second cobalt metal layer in the feature definition, comprising:
exposing the substrate to a deposition precursor gas mixture to deposit a portion of the second cobalt metal layer in the feature definition via a chemical vapor deposition process;
exposing the portion of the second cobalt metal layer to either a plasma treatment process or a hydrogen treatment process;
repeating exposing the substrate to the deposition precursor gas mixture and exposing the portion of the second cobalt metal layer to either the plasma treatment process or the hydrogen thermal treatment process until a predetermined thickness of the second cobalt metal layer is achieved; and
filling the feature definition with the second cobalt metal layer.

2. The method of claim 1, wherein the substrate includes at least a high-k dielectric layer having the feature definition formed therein, wherein the second cobalt metal layer is filled in the feature definition formed in the high-k dielectric layer.

3. The method of claim 1, wherein the hydrogen thermal treatment process comprises supplying a gas mixture including at least one of an inert gas and hydrogen gas ($H_2$) while providing heat energy to the second cobalt metal layer at a temperature from about 100 degrees Celsius to about 300 degrees Celsius.

4. The method of claim 3, wherein exposing the substrate to the deposition precursor gas mixture to deposit the portion of the second cobalt metal layer in the feature definition and exposing the portion of the second cobalt metal layer to either the plasma treatment process or the hydrogen thermal treatment process are performed in-situ in the same processing chamber.

5. The method of claim 1, wherein exposing the substrate to the deposition precursor gas mixture to deposit the portion of the second cobalt metal layer in the feature definition and exposing the portion of the second cobalt metal layer to either the plasma treatment process or the hydrogen thermal treatment process are performed simultaneously.

6. The method of claim 1, wherein exposing the portion of the second cobalt metal layer to the plasma treatment process comprises supplying a gas selected from hydrogen ($H_2$), nitrogen ($N_2$), ammonia ($NH_3$), and combinations thereof to reduce roughness of the portion of the second cobalt metal layer.

7. The method of claim 1, wherein the feature definition is selected from vias, trenches, lines and contact holes.

8. The method of claim 1, wherein the deposition precursor gas mixture includes a cobalt-containing precursor and a reducing gas.

9. The method of claim 1, wherein filling the feature definition with cobalt metal comprises a PVD cobalt re-flow process.

10. The method of claim 1, wherein the titanium barrier layer is deposited via a physical vapor deposition process and the titanium nitride barrier layer is deposited via an atomic layer deposition process.

11. The method of claim 1, further comprising thermally treating the wetting layer at a temperature from about 200 degrees Celsius to about 500 degrees Celsius in an environment containing an inert gas, hydrogen gas, or a combination thereof.

12. A method for depositing a metal layer for forming a semiconductor device, comprising:
   performing a barrier layer deposition process to deposit a barrier layer in a feature definition formed in a substrate, wherein the barrier layer deposition process comprises depositing a titanium barrier layer, a titanium nitride barrier layer, or a titanium barrier layer followed by a titanium nitride barrier layer;
   performing a wetting layer deposition process to deposit a wetting layer on the barrier layer, wherein the wetting layer deposition process comprises depositing a first cobalt layer via a physical vapor deposition process;
   performing a cyclic metal deposition process to deposit a second cobalt metal layer in the feature definition, comprising:
      exposing the substrate to a deposition precursor gas mixture to deposit a portion of the second cobalt metal layer in the feature definition via a chemical vapor deposition process;
      exposing the portion of the second cobalt metal layer to a hydrogen thermal treatment process;
      repeating exposing the substrate to the deposition precursor gas mixture and exposing the portion of the second cobalt metal layer to the hydrogen thermal treatment process until a predetermined thickness of the second cobalt metal layer is achieved; and
   filling the feature definition with the second cobalt metal layer.

13. The method of claim 12, wherein the substrate includes at least a high-k dielectric layer having the feature definition formed therein, wherein the second cobalt metal layer is filled in the feature definition formed in the high-k dielectric layer.

14. The method of claim 12, wherein the hydrogen thermal treatment process comprises supplying a gas mixture including at least one of an inert gas and hydrogen gas ($H_2$) while providing heat energy to the portion of the second cobalt metal layer at a temperature from about 100 degrees Celsius to about 300 degrees Celsius.

15. The method of claim 14, wherein exposing the substrate to the deposition precursor gas mixture to deposit the portion of the second cobalt metal layer in the feature definition and exposing the portion of the second cobalt metal layer to the hydrogen thermal treatment process are performed in-situ in the same processing chamber.

16. The method of claim 12, wherein exposing the substrate to the deposition precursor gas mixture to deposit the portion of the second cobalt metal layer in the feature definition and exposing the portion of the second cobalt metal layer to the hydrogen thermal treatment process are performed simultaneously.

17. The method of claim 12, wherein filling the feature definition with the second cobalt metal layer comprises a PVD cobalt re-flow process.

18. The method of claim 12, wherein filling the feature definition with the second cobalt metal layer comprises annealing the the second cobalt metal layer.

19. The method of claim 12, wherein filling the feature definition with the second cobalt metal layer comprises annealing the second cobalt metal layer.

20. The method of claim 12, further comprising thermally treating the wetting layer at a temperature from about 200 degrees Celsius to about 500 degrees Celsius in an environment containing an inert gas, hydrogen gas, or a combination thereof.

* * * * *

UNITED STATES PATENT AND TRADEMARK OFFICE
CERTIFICATE OF CORRECTION

PATENT NO. : 10,699,946 B2
APPLICATION NO. : 15/364780
DATED : June 30, 2020
INVENTOR(S) : Bhushan N. Zope et al.

Page 1 of 1

It is certified that error appears in the above-identified patent and that said Letters Patent is hereby corrected as shown below:

In the Drawings

On sheet 2 of 12, in Figure 2, Lines 5-6, delete "MICO-PROCESSOR" and insert -- MICRO-PROCESSOR --, therefor.

In the Specification

In Column 3, Line 7, after "disclosure;" delete "and".

In Column 5, Line 56, delete "Si<1111>)," and insert -- Si<111>), --, therefor.

In Column 16, Line 31, delete "acetlyacteonate" and insert -- acetylacetonate --, therefor.

In the Claims

In Column 28, Line 40, in Claim 1, after "hydrogen" insert -- thermal --.

In Column 29, Line 19, in Claim 9, after "with" insert -- the second --.

In Column 29, Line 19, in Claim 9, after "metal" insert -- layer --.

In Column 30, Line 38, in Claim 18, delete "the the" and insert -- the --, therefor.

In Column 30, Lines 39-41, in Claim 19, delete "The method of claim 12, wherein filling the feature definition with the second cobalt metal layer comprises annealing the second cobalt metal layer." and insert -- The method of claim 12, wherein the barrier layer deposition process is performed in a first processing chamber and the cyclic metal deposition process is performed in a second processing chamber. --, therefor.

Signed and Sealed this
Twenty-fifth Day of August, 2020

Andrei Iancu
*Director of the United States Patent and Trademark Office*